US006653549B2

(12) United States Patent
Matsushita et al.

(10) Patent No.: US 6,653,549 B2
(45) Date of Patent: Nov. 25, 2003

(54) PHOTOVOLTAIC POWER GENERATION SYSTEMS AND METHODS OF CONTROLLING PHOTOVOLTAIC POWER GENERATION SYSTEMS

(75) Inventors: Masaaki Matsushita, Nara (JP); Akiharu Takabayashi, Nara (JP); Masahiro Mori, Kyoto (JP); Ayako Shiomi, Shizuoka (JP); Chinchou Lim, Nara (JP); Takaaki Mukai, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/893,639

(22) Filed: Jun. 29, 2001

(65) Prior Publication Data

US 2002/0014262 A1 Feb. 7, 2002

(30) Foreign Application Priority Data

Jul. 10, 2000 (JP) ......................... 2000-207654

(51) Int. Cl.[7] ............................................. H01L 31/042
(52) U.S. Cl. ................... 136/244; 136/251; 136/290
(58) Field of Search ................. 136/243, 244, 136/251, 259, 291, 293, 290; 361/42, 20, 212; 340/541–567

(56) References Cited

U.S. PATENT DOCUMENTS 5,677,833 A * 10/1997 Bingley .................. 363/71
6,101,073 A * 8/2000 Takehara .................. 361/42
6,218,609 B1 * 4/2001 Mori et al. ................ 136/259
6,278,052 B1 * 8/2001 Takehara et al. ........... 136/244
6,404,336 B1 * 6/2002 Palumbo et al. ............ 340/540
2001/0023703 A1 * 9/2001 Kondo et al. .............. 136/244

FOREIGN PATENT DOCUMENTS

| DE | 2751200 A | * | 5/1979 | .......... E04H/17/00 |
| EP | 0884817 A2 | * | 12/1998 | |
| EP | 0949687 A2 | * | 10/1999 | |
| JP | 63-67718 | | 12/1988 | |
| JP | 07-177652 | * | 7/1995 | |
| JP | 08294348 A | * | 11/1996 | .......... A01M/29/00 |
| WO | WO 00/29856 A1 | * | 5/2000 | |

* cited by examiner

*Primary Examiner*—Alan Diamond
*Assistant Examiner*—Brian L Mutschler
(74) *Attorney, Agent, or Firm*—Fitzpatrick, Cella, Harper & Scinto

(57) ABSTRACT

There are provided a restricted area including an area in which solar cell modules are installed, a preventer for preventing intrusion of an intruder into the restricted area, and a detector capable of detecting the intrusion of the intruder into the restricted area, and a predetermined electric shock preventer is activated by a signal outputted from the detector upon detection of the intruder to prevent the intruder from receiving an electric shock.

22 Claims, 23 Drawing Sheets

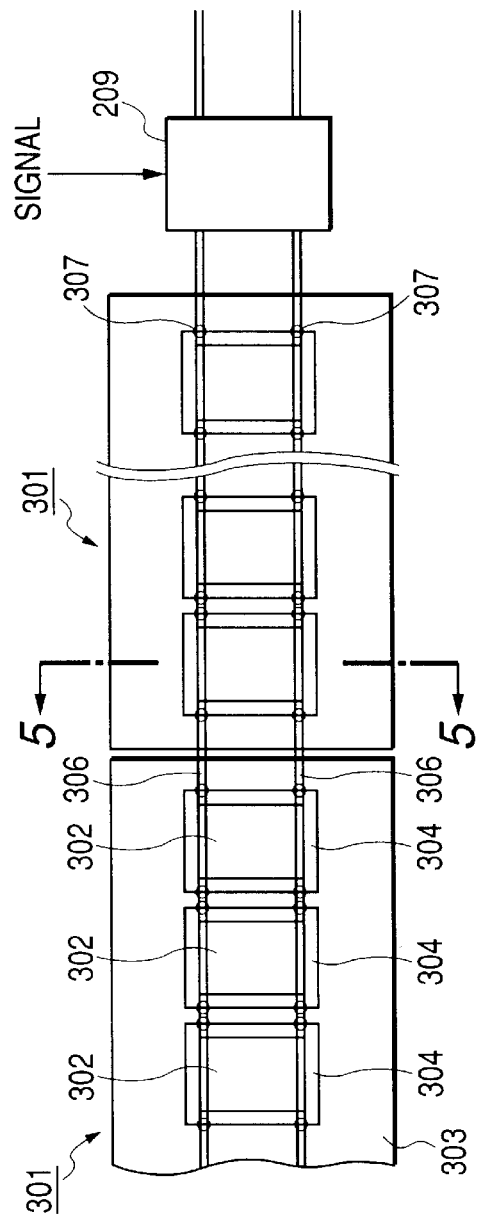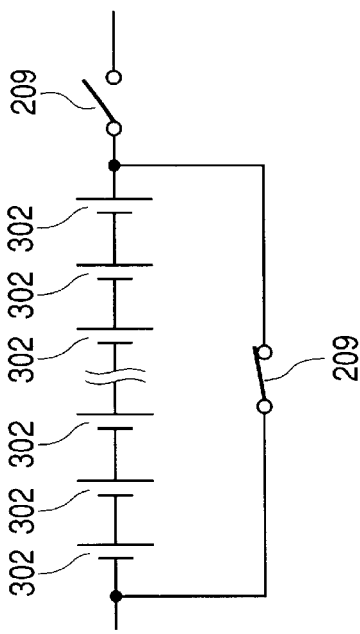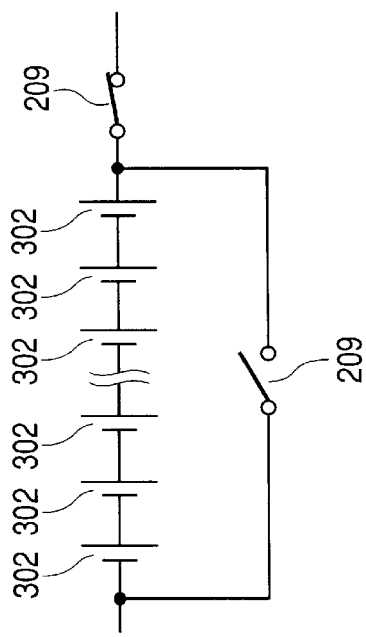

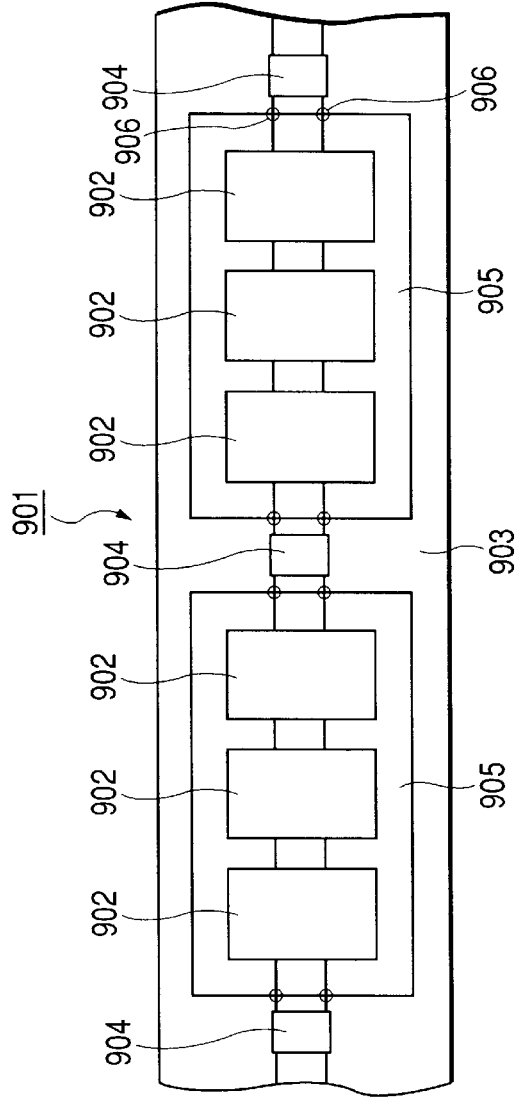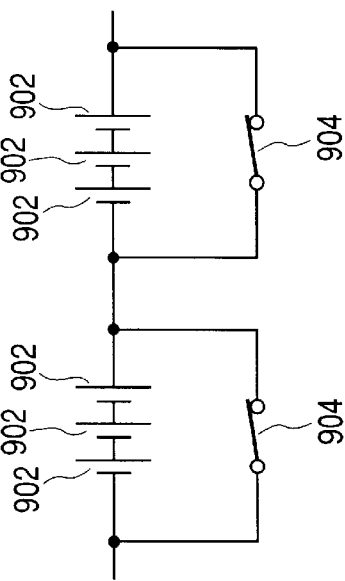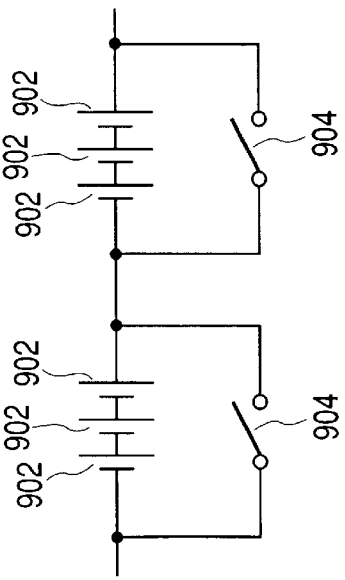

PHOTOVOLTAIC POWER GENERATION SYSTEMS AND METHODS OF CONTROLLING PHOTOVOLTAIC POWER GENERATION SYSTEMS

BACKGROUND OF THE INVENTION

1. Field of the Invention

The present invention relates to photovoltaic power generation systems and methods of controlling such photovoltaic power generation systems. More particularly, the present invention concerns photovoltaic power generation systems that are constructed to prevent an intruder, who is attempting to intrude into a restricted area including an area in which solar cells are installed, from receiving an electric shock, and methods of controlling such photovoltaic power generation systems.

2. Related Background Art

In recent years, awareness of environments is spreading across the world. Among others, serious concerns are exhaustion of fossil fuels and the like and global warming due to $CO_2$ emissions, so that the desire for clean energy is growing increasingly. Attention is thus being directed toward photovoltaic energy, which is clean energy resulting from direct conversion of solar energy to electric power, and solar cells are quickly spreading in use in various consumer-oriented fields.

In general solar cell modules possess sufficient electric insulation and enough safety to prevent an electric shock hazard even if a man should touch them. The solar cell modules are thus commercially available and are beginning to spread, but the solar cell modules involve an issue of still high cost, because a lot of coatings and insulators need to be used for ensuring the safety. Consequently, they are still unsatisfactory for application of solar cells high in power generation cost to power plants and thus are not used widely. On the other hand, there is a danger that an electric shock hazard may occur when a person except for a manager intrudes into a hazard controlled area in the power plants and the like, and it can extend to an accident in the electric power system. For eliminating this risk, studies have been made heretofore on various intrusion detecting devices and safety devices.

For example, an intruder detecting device described in Japanese Patent Publication No. 63-67718 is an intrusion detecting device composed of an outer detector placed around facilities, though not a power generation plant, and functioning to detect a passing object, an inner detector placed between the outer detector and the facilities and around the facilities and functioning to detect a passing object, an outer detecting circuit and an inner detecting circuit each having a filter for passing only frequencies caused by passage of a manager or a person concerned, among output of the outer and inner detectors, and a level detector for detecting only vibration levels due to a man, and an intrusion detecting circuit for counting output of the outer or inner detecting circuit and producing an intrusion detection signal when a count reaches a predetermined value within a given time.

Conventionally, studies were conducted on methods of preventing intrusion of an intruder or on methods of detecting an intruder by making use of the monitoring method as described above. In the conventional power plants such as thermal power plants, atomic power plants, and so on, however, if the system is brought once to a halt, a considerable time will be required for a restart of the system and thus the halt will cause great disadvantage. Therefore, there was no conception that the entire power generation system was brought to a halt as a safeguard against intruders and, simply, an alarm or the like was issued to let guards notice.

The photovoltaic power generation systems with solar cells installed on the roofs of general houses have becoming widespread in these years.

In such photovoltaic power generation systems, solar cell modules are connected in series to obtain a desired voltage. This series of solar cell modules is generally called a string. Several strings are connected in parallel to obtain a desired electric current, thus constructing a solar cell array with a power generation scale of desired value. This solar cell array is equipped with components for control and connection of peripheral equipment, thereby composing a photovoltaic power generation system. Accordingly, the solar cell array becomes larger with increase in the power generation scale required of the photovoltaic power generation system, and the number of solar cell modules constituting it also increases. Therefore, in designing of a photovoltaic power generation system, the system is formed by connecting the predetermined number of modules or solar cells of a predetermined area in series and in parallel so as to realize predetermined output voltage and current and a predetermined power generation capacity.

It is feasible to implement power generation with a greater capacity, by increasing the number of series/parallel solar cell modules. However, as the power generation capacity increases, the voltage and current also become larger with increase in the number of series/parallel modules. In general the power generation capability of solar cells is determined by intensity of sunlight incident thereto. Describing it in brief, the photovoltaic power generation system operating at a fixed voltage varies its operating current with variation in insolation (solar radiation) to determine its output power.

The photovoltaic power generation system and the method of protecting the power generation system, described in Japanese Patent Application Laid-Open No. 7-177652, are configured to have a first switch for effecting connection or disconnection between positive and negative power terminals of a solar cell string and output lines connected in parallel thereto and outputting power, a second switch for establishing a short circuit or an open circuit between the power output terminals, and a controller for comparing a voltage value between detection terminals at a predetermined position of the solar cell string, with a predetermined value and controlling switching of the first switch and the second switch, based on the comparison signal. In the photovoltaic power generation system and the method of protecting the photovoltaic power generation system, the solar cell string is judged abnormal when the voltage value between the detection terminals thereof becomes not more than the predetermined value, the power output terminals of this solar cell string are then disconnected from the output lines, and a short circuit is established between the power output terminals, thereby isolating and deactivating the defective solar cell string from the photovoltaic power generation system.

However, in the case of the power plants using the solar cell modules, since the installation scale was large and a large area was necessary, it was difficult to prevent the electric shock hazard only by the conventional means of simply giving an alarm or the like to let the guards note the intrusion of intruder and the number of guards was preferably as small as possible from the aspect of cost. Therefore, the conventional means had a limit.

The solar cell modules used in the photovoltaic power generation systems are usually designed so as to ensure the electrical insulation performance in normal use in the initial stage and after installation. It cannot be denied, however, that there is a possibility of degradation or failure of electrical insulation due to unpredictable causes after installation. There can also occur failure of electrical insulation, for example, due to breakage of the coating over the surface of the solar cell modules, cracks, scars, deformation, etc. of surface glass, and so on for some reason. No one can deny that there is a risk of an electric shock or the like when a man comes to near an exposed portion or a defective portion appearing unpredictably and touches it. The risk of electric shock is high with failure of electrical insulation, particularly, in the case of the large power generation scales, because the voltage and current also become large with increase in the number of series and parallel solar cells, as described previously.

In addition, the solar cell arrays are often installed relatively near the ground with the recent proliferation of the photovoltaic power generation systems, and there is an increasing possibility that a child or a worker not associated with the photovoltaic power generation apparatus (photovoltaic power generation system) touches the solar cell array. It is thus also becoming important to give consideration to prevention of an electric shock. It is the present status that the solar cell array is located within a secure fence and the solar cell array is not allowed to be located at a place which a lot of people go into and out of.

The photovoltaic power generation system and the protection method of the photovoltaic power generation system described in No. 7-177652 were configured to disconnect the solar cell string upon occurrence of disadvantage and no consideration was given to the safeguard against intruders. No consideration was given to malfunctions of the protection system, e.g., in the case of weak insolation, either.

SUMMARY OF THE INVENTION

The present invention has been accomplished in order to solve the above-stated problems and it is an object of the present invention to provide photovoltaic power generation systems with high safety and of low cost that can prevent an electric shock hazard of an intruder intruding into a restricted area or the like in the photovoltaic power generation system and that does not have to be always monitored by a manager or a person concerned, and methods of controlling such photovoltaic power generation systems.

Another object of the present invention is to provide a method of controlling a photovoltaic power generation system with high safety while taking account of the installation site and installation method of the solar cell modules.

For achieving the above objects, provided according to a first aspect of the present invention is a photovoltaic power generation system comprising a solar cell module, a restricted area including an area in which the solar cell module is installed, detecting means for detecting intrusion of an intruder into the restricted area to output a signal, and electric shock preventing means activated by the signal outputted from the detecting means.

Provided according to a second aspect of the present invention is a method of controlling a photovoltaic power generation system comprising a solar cell module, a restricted area including an area in which the solar cell module is installed, detecting means for detecting intrusion of an intruder into the restricted area, and electric shock preventing means, wherein when the detecting means detects the intrusion of the intruder into the restricted area, the electric shock preventing means is activated based on a signal outputted from the detecting means.

In the first and second aspects of the present invention, the photovoltaic power generation system preferably comprises means for preventing the intrusion of the intruder into the restricted area.

Provided according to a third aspect of the present invention is a method of controlling a photovoltaic power generation system comprising a solar cell array comprised of a plurality of solar cell modules connected, one sensor or a plurality of sensors arranged around the solar cell array, and a switch for establishing a short circuit between output terminals of the solar cell array, wherein the short circuit between the output terminals is established based on an output signal from the sensor.

It is preferable that the short circuit between the output terminals be established when the output signal of the sensor is not more than a predetermined value.

Provided according to a fourth aspect of the present invention is a method of controlling a photovoltaic power generation system comprising a plurality of solar cell strings each consisting of a plurality of solar cell modules, a plurality of sensors arranged around each of the solar cell strings, and a plurality of switches for establishing a short circuit between output terminals of each of the solar cell strings, wherein the plurality of solar cell strings are connected in parallel and the short circuit between output terminals is established on a string-by-string basis for the plurality of solar cell strings, based on output signals from the plurality of sensors.

It is preferable that when output signals from some of the plurality of sensors are not more than a predetermined value, the short circuit between output terminals be established for each of solar cell strings corresponding to the sensors having outputted the output signals of not more than the predetermined value.

Provided according to a fifth aspect of the present invention is a method of controlling a photovoltaic power generation system comprising a solar cell string comprised of a plurality of solar cell modules connected, a plurality of sensors provided around the solar cell string, and a switch for establishing a short circuit between output terminals of the solar cell string, based on output signals from the plurality of sensors, the method comprising:

a first step of measuring the output signals from the plurality of sensors;

a second step of normalizing values of the output signals;

a third step of calculating a comparison calculated value D, which is defined below, when at least one of a plurality of normalized output signal values Ax is larger than a reference value S, the comparison calculated value D=(a minimum of the plurality of normalized output signal values Ax)/(a maximum of the plurality of normalized output signal values Ax); and a fourth step of establishing the short circuit between the output terminals by the switch when the comparison calculated value D is smaller than a comparison reference value D0.

It is preferable that an alarm be issued before the short circuit between the output terminals is established.

Provided according to a sixth aspect of the present invention is a method of controlling a photovoltaic power generation system comprising a plurality of solar cell strings connected in parallel, each solar cell string being comprised of a plurality of solar cell modules connected and having a plurality of sensors provided around the solar cell string and a switch for establishing a short circuit between output terminals of the solar cell string, the method comprising:

(1) carrying out for each of the plurality of solar cell strings, a first step of measuring output signals from the plurality of sensors, a second step of normalizing values of the output signals, and a third step of calculating a comparison calculated value Dy, which is defined below, when at least one of a plurality of normalized output signal values Ax is larger than a reference value S, the comparison calculated value Dy=(a minimum of the plurality of normalized output signal values Ax)/(a maximum of the plurality of normalized output signal values Ax); and (2) carrying out a fourth step when at least one of the comparison calculated values Dy of the plurality of solar cell strings is smaller than a comparison reference value D0, the fourth step being a step of establishing a short circuit between output terminals of a solar cell string corresponding to the comparison calculated value Dy smaller than the comparison reference value D0, by the switch.

It is preferable that before the short circuit is established between the output terminals of the solar cell string corresponding to the comparison calculated value Dy smaller than the comparison reference value D0, an alarm be issued for the solar cell string.

It is also preferable that the sensors be comprised of solar cells.

With the photovoltaic power generation system and the control method thereof according to the first and second aspects of the present invention, guards do not have to always monitor intruders and upon detection of an intruder the guards do not have to instantly go to the place and activate a safeguard such as prevention of an electric shock or the like. Therefore, the number of guards can be reduced. Further, the safety is ensured for the intruders. The detecting means issues a signal at the same time as the detection of the intruder and the signal activates the electric shock preventing means such as means for establishing an entire short circuit or an entire open circuit, e.g., for every module or for every safety voltage, or means for establishing a short circuit for every string. Therefore, the intruder can be prevented from receiving an electric shock, without spending a long time from the detection of the intruder to activation of the safeguard.

In the photovoltaic power generation system according to the first and second aspects of the present invention, the means for preventing the intrusion of the intruder is preferably a stockade, a wall, a fence, or a ditch. This keeps the intruder from readily making access to the restricted area and thus makes it feasible to prevent an electric shock hazard and an accident reaching the electric power system.

It is also preferable that the means for preventing the intrusion of the intruder be double means for preventing the intrusion. This makes it harder for the intruder to readily enter the restricted area than in the case of the single means for preventing the intrusion, and makes it feasible to better prevent the electric shock hazard and the accident reaching the electric power system.

It is also preferable that the detecting means be provided on the inside means for preventing the intrusion of the intruder out of the double means for preventing the intrusion of the intruder. This can decrease malfunctions in detection of intruders, as compared with configurations wherein the detecting means is provided on the single means for preventing the intrusion or wherein the detecting means is provided on the outside means for preventing the intrusion out of the double means for preventing the intrusion, and thus the operating rate of the photovoltaic power generation system can be increased.

In the photovoltaic power generation system and the control method thereof according to the first and second aspects of the present invention, the detecting means is preferably a proximity sensor, an optical sensor, a magnetic sensor, a magnet sensor, a temperature sensor, a humidity sensor, an impact sensor, an acceleration sensor, a weight sensor, a current sensor, or an electromagnetic sensor. When either of these electronic sensors is used, the detection accuracy is enhanced and centralized monitoring can be performed. Therefore, the number of guards can be reduced and, besides, it also becomes easier to ensure the safety for intruders. In addition, the guards do not have to always monitor the intruders and upon detection of an intruder the guards do not have to activate the safeguard such as prevention of an electric shock or the like every time. Therefore, the period from the detection of intruder to the activation of the safeguard can be reduced more whereby the intruder can be prevented from receiving an electric shock.

The electric shock preventing means is preferably means for bringing the solar cell module or a solar cell string consisting of solar cell modules connected in series, into a short-circuit state. This enables the system to be shut down immediately without breaking the photovoltaic power generation system and further renders the voltage null at each part of the series solar cell modules, whereby the intruder can be prevented from experiencing a hazard such as an electric shock or the like. Besides, it becomes feasible to restore the normal operation to the system immediately after confirmation of safety.

It is also preferable that a circuit breaker be provided in the electric shock preventing means to disconnect the solar cell module or the solar cell string from the photovoltaic power generation system to deactivate the module or the string. This configuration can prevent the intruder from experiencing a hazard such as an electric shock or the like, without damaging the photovoltaic power generation system and makes it feasible to reset the system immediately after confirmation of safety.

It is preferable that at least two solar cell strings be connected in parallel to constitute a solar cell array.

The electric shock preventing means preferably has a function of releasing an electric shock preventing action.

As described above, the photovoltaic power generation system and the control method thereof according to the first and second aspects of the present invention are directed toward the system that can safely stop the function of the power generating system itself in order to prevent the intruder from receiving an electric shock by the simple method in the power plants and others using the solar cell modules. More specifically, a power plant itself is provided with means for terminating the power generating system itself in order to ensure the absolute safety under a condition in which there exists no high voltage in the array, for ensuring the safety of people. Since the structure with emphasis on maintenance is important under such environments as the power plants, the safety is also ensured for the intruders and others in the system optimized for the structure.

When the photovoltaic power generation system and the control method thereof according to the first and second aspects of the present invention are applied, particularly, to the power plants, it is necessary to lower the cost of the solar cell modules as much as possible. A conceivable means for lowering the cost is decrease in materials making the solar cell modules. Since the photovoltaic power generation system used in the power plant can be equipped with some measures for preventing people except for operators from entering the interior of the plant, as a hazard controlled area, there is a high possibility that necessary insulation is not so high, different from the conventional solar cell modules, and emphasis is placed on maintainability. Therefore, the live portions are preferably exposed and a coating material making the solar cell modules is laid only near each cell. It is thus contemplated that the cost can be largely curtailed down to a minimum and there arises no problem even with some degradation of safety, e.g., exposure of live portions in part. Namely, the inventors found that simple coatings were enough and effective for the solar cell modules under such special environments as the power plants, thus accomplishing the invention below.

In the photovoltaic power generation system and the control method according to the first and second aspects of the present invention, the solar cell module is preferably installed so that a photovoltaic element provided in an outermost surface on the light-receiving side is exposed directly to the atmosphere. This configuration causes no energy loss of incident light due to absorption and/or reflection by the surface coating or the like, whereby the incident light can be efficiently converted to electricity.

It is also preferable that the solar cell module have a coating only on the outermost surface on the light-receiving side. This can largely decrease the material cost and even if a solar cell is broken it can be readily replaced with another.

It is also preferable that the solar cell module be coated at least on a module-by-module basis on the light-receiving side. This can enhance weatherability of solar cells. When a solar cell is broken, replacement thereof is easy, because only the coating can be peeled off from the defective solar cell. Besides, cost for replacement can be reduced greatly.

In the photovoltaic power generation system the live portions are preferably exposed in part. This permits a manager to readily find a defective module whereby workability of inspection can be improved remarkably.

The control method of the photovoltaic power generation system according to the third aspect of the present invention further comprises the following features: the short circuit is established between output terminals of the solar cell array when the output signal of the sensor is not more than a predetermined value; an alarm is issued before the short circuit is established between the output terminals of the solar cell array; when the output signal of the sensor is not more than a predetermined value, an alarm is issued and thereafter the short circuit is established between the output terminals of the solar cell array after a lapse of a predetermined time; the short-circuit state between the output terminals of the solar cell array is retained before a release operation is carried out.

The control method of the photovoltaic power generation system according to the fourth aspect of the present invention further comprises the following features: the short circuit is established between output terminals of each string when an output signal of a sensor for each string of the solar cell array is not more than a predetermined value; an alarm is issued before the short circuit is established between output terminals of each string of the solar cell array; when an output signal of a sensor for each string of the solar cell array is not more than a predetermined value, an alarm is issued and thereafter the short circuit is established between output terminals of each string after a lapse of a predetermined time; a short-circuit state between output terminals of each string of the solar cell array is retained before a release operation is carried out.

In the control method of the photovoltaic power generation system according to the third and fourth aspects of the present invention, when output signals from the sensors laid around the solar cell array are detected and when it is determined that a human shadow is detected in a local part of the array from the signals, the switch between terminals of the array or a string are controlled to short the array or the string. Even if there is breakage of the surface coating or an insufficient insulation portion such as a crack, a scratch, deformation, etc. of surface glass in the solar cell module, a shock hazard can be prevented when a man touches that part.

In the first to fourth aspects of the present invention, it is also preferable that the solar cell module have a coating only on the outermost surface on the light-receiving side. This permits remarkable reduction of material cost and in the event of disadvantage in a solar cell it can be replaced readily.

It is also preferable that the solar cell module be coated at least on a module-by-module basis on the light-receiving side. This permits improvement in weatherability of solar cells and in the event of disadvantage in a solar cell replacement thereof can be done readily, because only the coating of the defective solar cell can be peeled off. Besides, the cost for the replacement can be reduced remarkably.

In the photovoltaic power generation system the live portions are preferably exposed in part. This permits the manager to readily find a defective module whereby the workability of inspection can be improved remarkably.

In the fifth and sixth aspects of the present invention, the signals of the respective sensors are compared with each other, whereby the shock hazard can be prevented while preventing malfunctions such as unwanted output of alarm, an unwanted short circuit of the solar cell array or the solar cell string, and so on. In this case, it is preferable to issue an alarm before the short circuit is established for the solar cell array or the like.

The configurations and effects of the present invention will be described hereinafter in detail with reference to the drawings.

BRIEF DESCRIPTION OF THE DRAWINGS

FIGS. 4A, 4B and 4C are drawings showing solar cell modules used in the photovoltaic power generation system according to Example 1 of the present invention, in which FIG. 4A is a block diagram of the solar cell modules, FIG. 4B a circuit diagram showing a state of normal power generation of the solar cell string, and FIG. 4C a circuit diagram showing a state of a short circuit of the solar cell string;

FIGS. 9A, 9B and 9C are drawings showing solar cell modules used in the photovoltaic power generation system according to Example 3 of the present invention, in which FIG. 9A is a block diagram of the solar cell modules, FIG. 9B a circuit diagram showing a state of normal power generation of the solar cell string, and FIG. 9C a circuit diagram showing a state of a short circuit of the solar cell string;

FIGS. 11A, 11B and 11C are drawings showing solar cell modules used in the photovoltaic power generation system according to Example 4 of the present invention, in which FIG. 11A is a block diagram of the solar cell modules, FIG. 11B a circuit diagram showing a state of normal power generation of the solar cell string, and FIG. 11C a circuit diagram showing a state of a short circuit of the solar cell string;

DETAILED DESCRIPTION OF THE PREFERRED EMBODIMENTS

The embodiments of the present invention will be described below with reference to the drawings.

First Embodiment

The first embodiment presents an embodiment of a photovoltaic power generation system according to the present invention.

Figure 1:
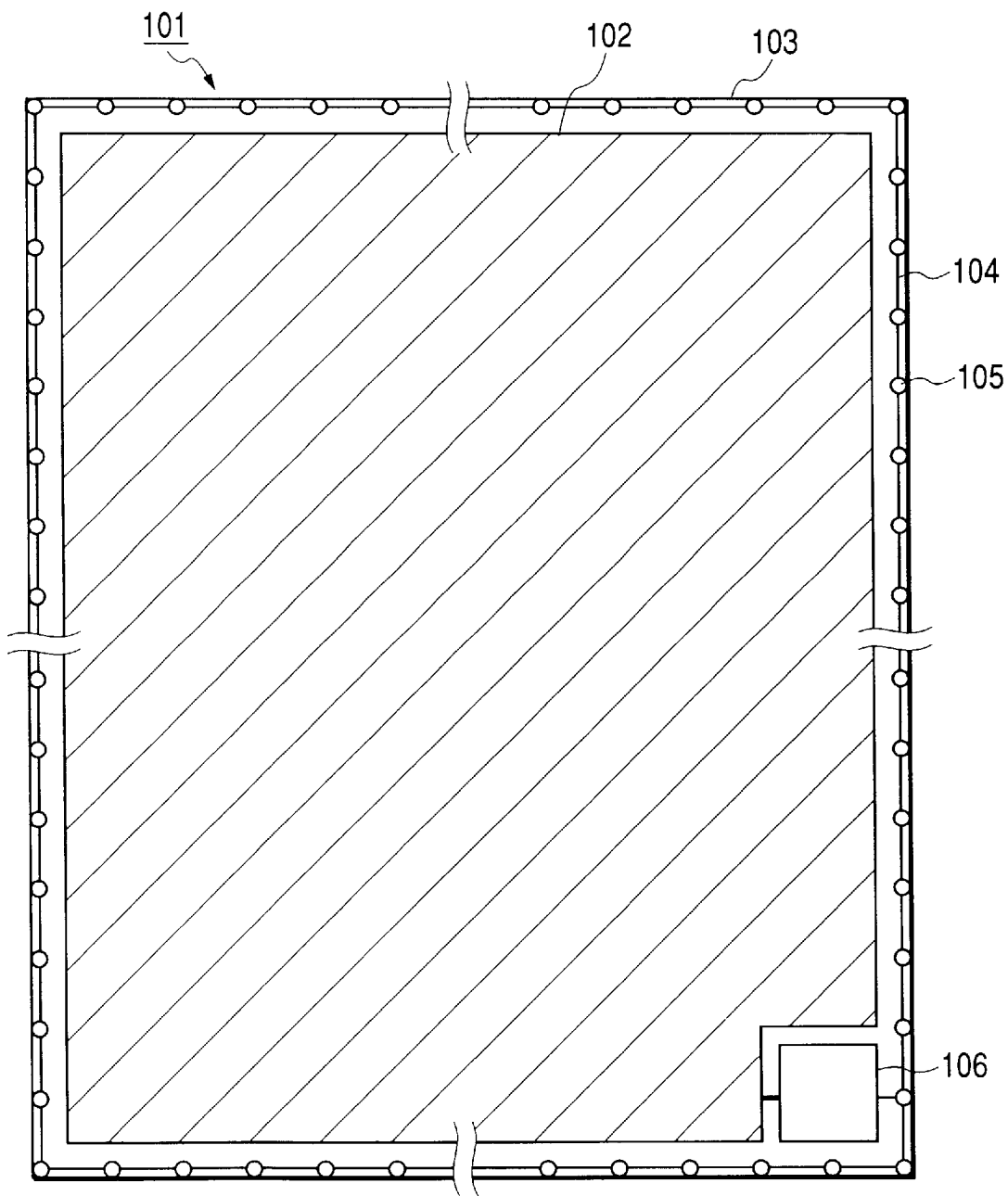
FIG. 1 is a layout drawing of a photovoltaic power generation system according to the first embodiment of the present invention.

FIG. 1 is a layout drawing showing a photovoltaic power generation system 101 of the present invention, which has a restricted area 103 including an area 102 where solar cell modules are installed, a means 104 for preventing an intruder from intruding into the restricted area 103, intruder detecting means 105 mounted on the means 104 for preventing the intrusion of intruder, and a building 106 in which devices necessary for the photovoltaic power generation system 101 are located.

Located inside the building 106 are a junction box for connecting solar cell strings in parallel, an inverter for converting a dc power generated by the solar cell modules, to an ac power, and an electric shock preventing means which is activated by a signal outputted when the intruder detecting means 105 detects an intruder. This photovoltaic power generation system is constructed so that either of the intruder detectors 105 mounted on the fence (the means 104 for preventing the intrusion of intruder) detects an intruder and, at the same time as the detection of intruder, the electric shock preventer is activated by a signal outputted from the detector 105, thereby preventing the intruder from receiving an electric shock.

Each of the components will be described below.

Photovoltaic Power Generation System

The photovoltaic power generation system is constructed of the solar cell modules connected in series to obtain a desired voltage. This series of solar cell modules is generally called a string. Several strings are connected in parallel to constitute a solar cell array with a power generation scale of a desired value. The solar cell array is further provided with each of additional components, e.g., such as a power converting unit or the like for control, protection, and connection of peripheral equipment, thus constituting the photovoltaic power generation system. For example, each solar cell module is mounted on a frame placed at an optimal slope to incident light, and electrical conduction between solar cell modules and solar cells is established by connecting them by use of metal foil such as copper foil or the like and by solder or the like. The metal foil is preferably bonded to a back reinforcement or the frame of the solar cell modules with double-sided adhesive tape or the like so as to resist disconnection.

Restricted Area

The restricted area indicates a site where mechanical appliances, bus-bars, etc. of a high voltage or an extra high voltage are laid outdoors, including the area where the solar cells are located. It is also preferable to provide the means for preventing the intrusion of intruder, such as a stockade, a wall, a fence, a ditch, or the like, so as to prevent people except for a person in charge from entering the interior of the restricted area. It is also desirable to display a keep-out sign at the exit/entrance.

Solar Cells

There are no specific restrictions on the solar cells, and the solar cells can be selected, for example, from those using semiconductor materials such as monocrystalline, polycrystalline, compound, thin-film, amorphous, and other semiconductor materials. The amorphous semiconductor solar cells are, for example, those having a layer structure in which a back electrode layer, a transparent, conductive layer, an n-type semiconductor layer, an intrinsic semiconductor layer, a p-type semiconductor layer, and a transparent electrode layer are stacked in order on a substrate of a conductive material or an insulating material, and a collector electrode of such a branch pattern as not to intercept incident light is formed on the uppermost, transparent electrode layer which is a light entrance surface. It is, however, noted that the solar cells do not have to be limited, particularly, to this structure.

Solar Cell Modules

As forms of the solar cell modules there are modules using crystalline cells, thin-film cells, or polycrystalline cells, but there are no specific restrictions thereon. However, the solar cell modules suitably applicable to the power plants are desirably those having a simple coating structure in which live portions are exposed; for example, the solar cell modules of easy maintenance with necessary minimum weatherability in which coatings are provided only on light-receiving surfaces of photovoltaic elements directly formed on a metal substrate such as weather-resistant SUS or the like and in which the cells are bonded directly to a frame or the like.

Coatings

The coatings are used for the purpose of enhancing the weatherability of the solar cell modules, e.g., protecting the solar cell modules from external contaminants, preventing the modules from being scratched from outside, and so on. Accordingly, the coatings need to satisfy requirements of transparency, weatherability, and contamination resistance. Suitably applicable materials meeting such requirements are fluororesin, acrylic resin, urethane resin, silicone resin, glass, and so on. Easy coating methods of laying such materials on the light-receiving surfaces include a laminating method of coating film, a laying method by coating, a bonding method with adhesive, and so on.

The coatings are provided only on the front surfaces in some cases or are also provided on the back surfaces in some other cases, depending upon purposes of use. In application to the power plants, there are cases where the coatings are provided only near the solar cells, e.g., for the purpose of cost reduction. A particularly suitable material is a polyethylene protective sheet using a polyethylene film as a base material of an adhesive film capable of being bonded to the photovoltaic elements and using an acrylic adhesive as the adhesive, because it is inexpensive and excellent in weatherability.

Detecting Means

The detecting means represent means having a sensor or the like capable of detecting a man, an animal, or the like and having a function of issuing a signal indicating the intrusion, to the electric shock preventer. There are no specific restrictions on the detecting means, but suitable detecting means can be selected, for example, from electronic sensors such as proximity sensors, optical sensors, magnetic sensors, magnet sensors, temperature sensors, humidity sensors, impact sensors, acceleration sensors, weight sensors, current sensors, electromagnetic sensors, and so on.

Junction Box

The junction box functions to connect power outputs from the strings and often incorporates a string disconnecting means capable of disconnecting the strings separately from each other, a power collecting means for collecting powers generated by the strings, a reverse current preventing means for preventing a reverse current between strings, a dc shutting means for shutting off a direct current collected, and a maintenance/inspection means capable of measuring an open-circuit voltage and an insulation resistance of the solar cell array. For example, the means for connecting the output powers from the strings can be a string disconnector and a branch disconnector, the string disconnecting means capable of disconnecting the strings separately from each other can be the collector electrode of copper sheet, the reverse current preventing means for preventing the reverse current between strings can be a reverse current preventing diode, the dc shutting means for shutting off the direct current collected can be a dc breaker, and the maintenance/inspection means capable of measuring the open-circuit voltage and insulation resistance of the solar cell array can be measurement terminals or the like, e.g., portions of solar cell electric paths, such as the positive and negative terminals of breaker, the copper sheet, the earth terminal, and so on.

Electric Shock Preventing Means

The electric shock preventing means represents a means for bringing the photovoltaic power generation system itself to a halt. By bringing the system to a halt, it is feasible to prevent an electric shock on a man or the like. For example, the electric shock preventing means can be either of a shorting switch for shorting a solar cell, an opening switch for establishing an open circuit of a solar cell, a switch for shorting a solar cell string, etc., which is activated by a signal outputted when a sensor for detecting a man or the like, disposed near the solar cell modules, detects a man or the like. Especially, the means for shorting a solar cell is desirable, because there is no risk of electric shock when a man touches any live portion of the shorted solar cell module. A specific configuration example is one in which the intruder detecting sensors are located in the vicinity of the solar cell modules placed in the restricted area, the solar cell shorting switch is activated by a signal outputted when the intruder detecting sensor detects an intruder, and the intruder could be prevented from receiving an electric shock even if the intruder should touch a part of the photovoltaic power generation system. In the case of the open circuits being established for the respective solar cell strings, where an opening switch is provided for every solar cell string, a high voltage can be placed at live portions, so as to raise the risk of electric shock. Therefore, the shorting means are more preferable.

Shorting Means

The shorting means represents a means for establishing a short circuit by connecting the positive and negative electrodes of the photovoltaic power generation circuit with a conductor wire. Although there are no specific restrictions on the shorting means, it can be selected, for example, from a method of switching with a semiconductor device such as a transistor, IGBT, GTO, MOSFET, a thyristor, or the like, a method of mechanical switching with a magnet conductor, a relay, or the like, and so on.

Opening Means

The opening means represents a means for establishing an open circuit by disconnection between the positive and negative electrodes of the photovoltaic power generation circuit. Although there are no specific restrictions on the opening means, it can be selected, for example, from a method of switching with a semiconductor device such as a transistor, IGBT, GTO, MOSFET, a thyristor, or the like, a method of mechanical switching with a magnet conductor, a relay, or the like, and so on.

Second Embodiment

The second embodiment presents an embodiment of a control method of photovoltaic power generation apparatus (photovoltaic power generation system) according to the present invention.

Figure 14:
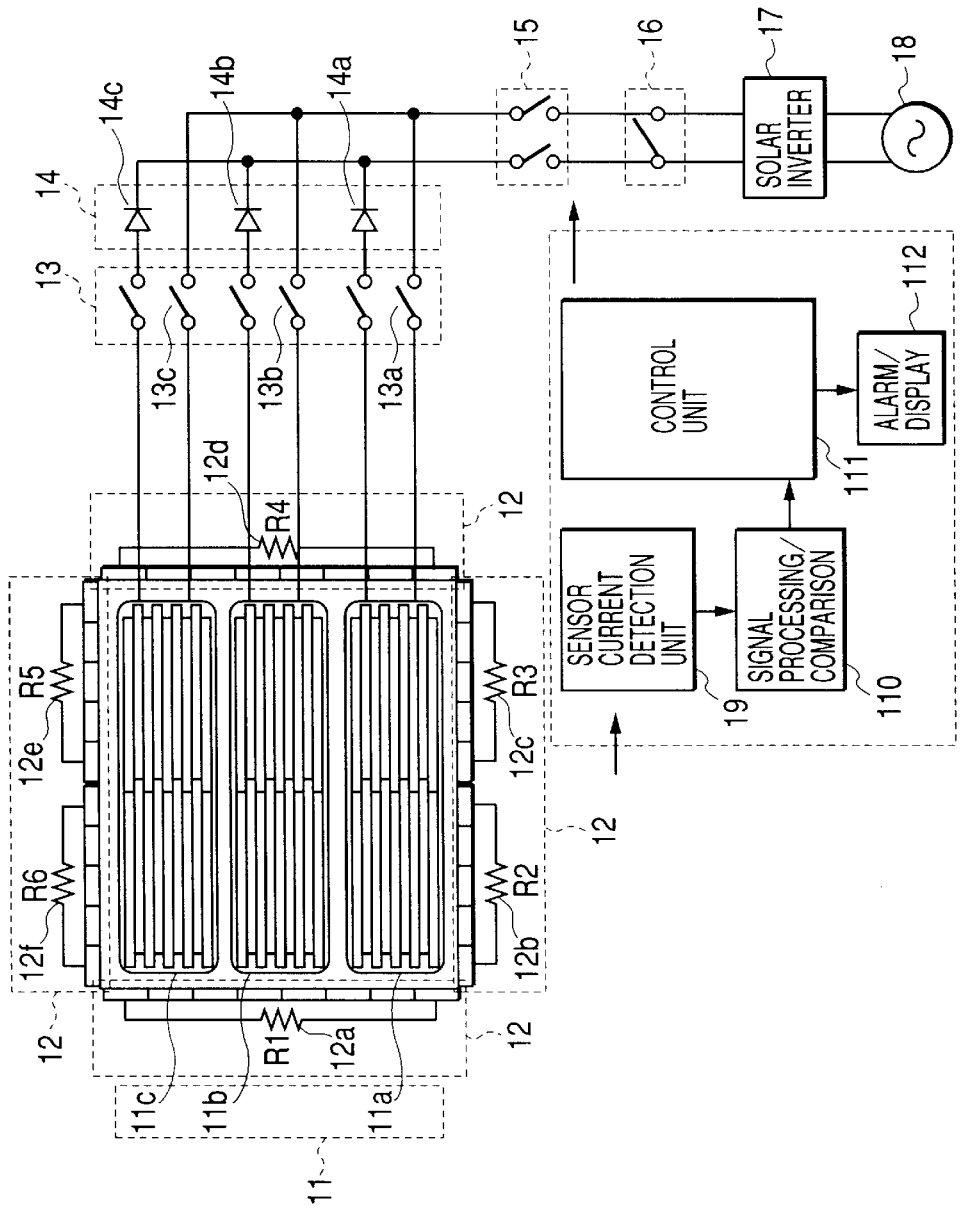
FIG. 14 is a block diagram of a photovoltaic power generation system according to the second embodiment and Example 6 of the present invention.
Figure 15:
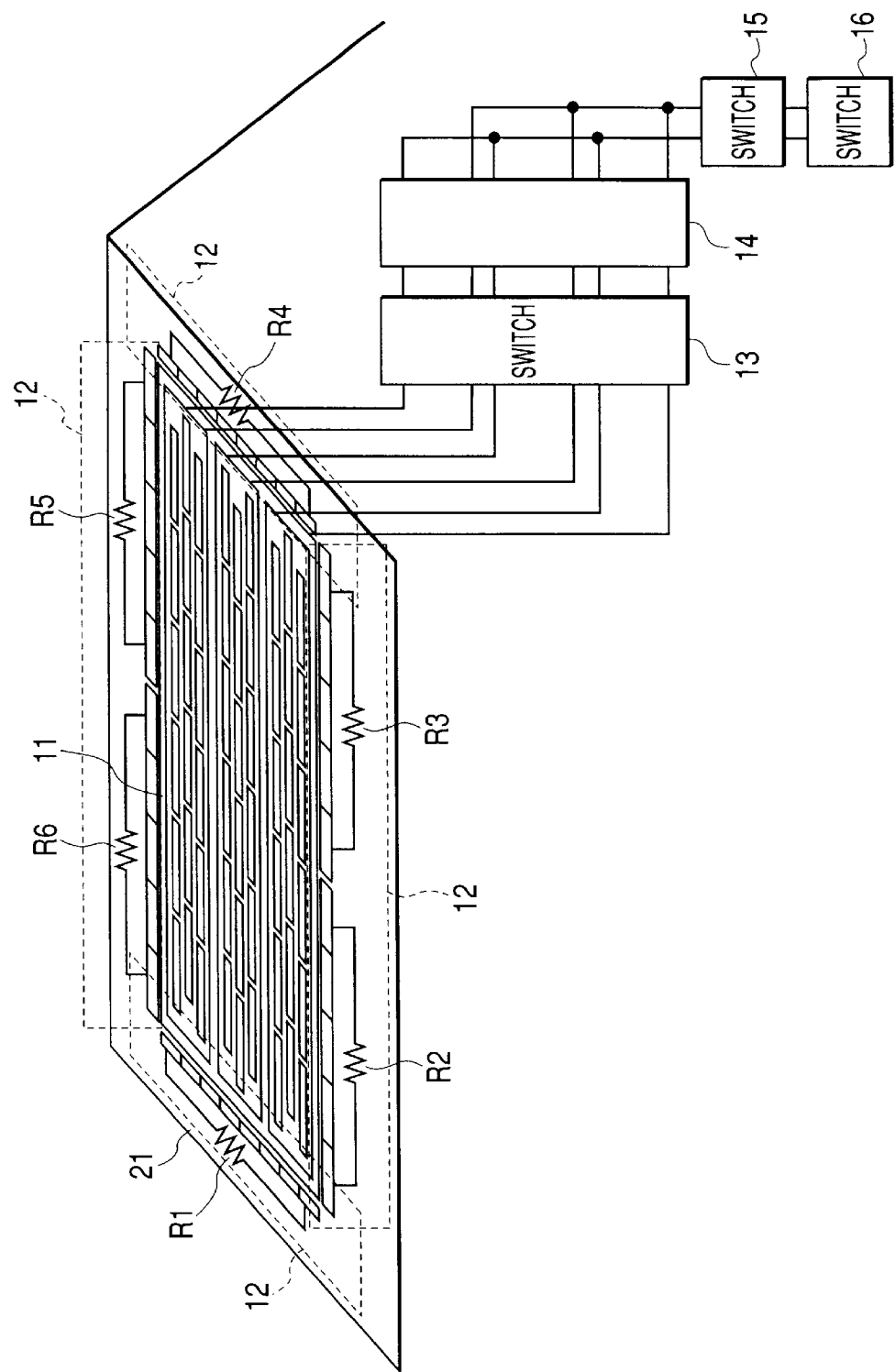
FIG. 15 is a block diagram showing a roof configuration of the photovoltaic power generation system according to the second embodiment and Example 6 of the present invention.

FIG. 14 is a block diagram of a photovoltaic power generation apparatus (photovoltaic power generation system) according to the second embodiment and FIG. 15 a block diagram of a roof configuration on which the photovoltaic power generation system is installed.

In the photovoltaic power generation system according to the present embodiment, each solar cell string ($11a$ to $11c$) is composed of sixteen solar cell modules connected in series, and a solar cell array 11 is composed of three solar cell strings connected in parallel and is laid on a roof 21 of a building.

The positive terminal and negative terminal of each solar cell string ($11a$ to $11c$) are guided to a switch 13 for photovoltaic power generation system and a reverse current preventing diode 14 is provided in positive wires. These solar cell strings are connected in parallel and wires thereof are guided to a main switch 15 and an array shorting switch 16. A solar inverter 17 is connected to a commercial ac system 18 of a house switchboard. Also provided is a sensor detection unit 19, a signal processing/comparison 110, a control unit 111, and an alarm/display 112. The solar cells in the present embodiment may be of the crystalline type or the amorphous type (including the microcrystalline type).

Figure 16:
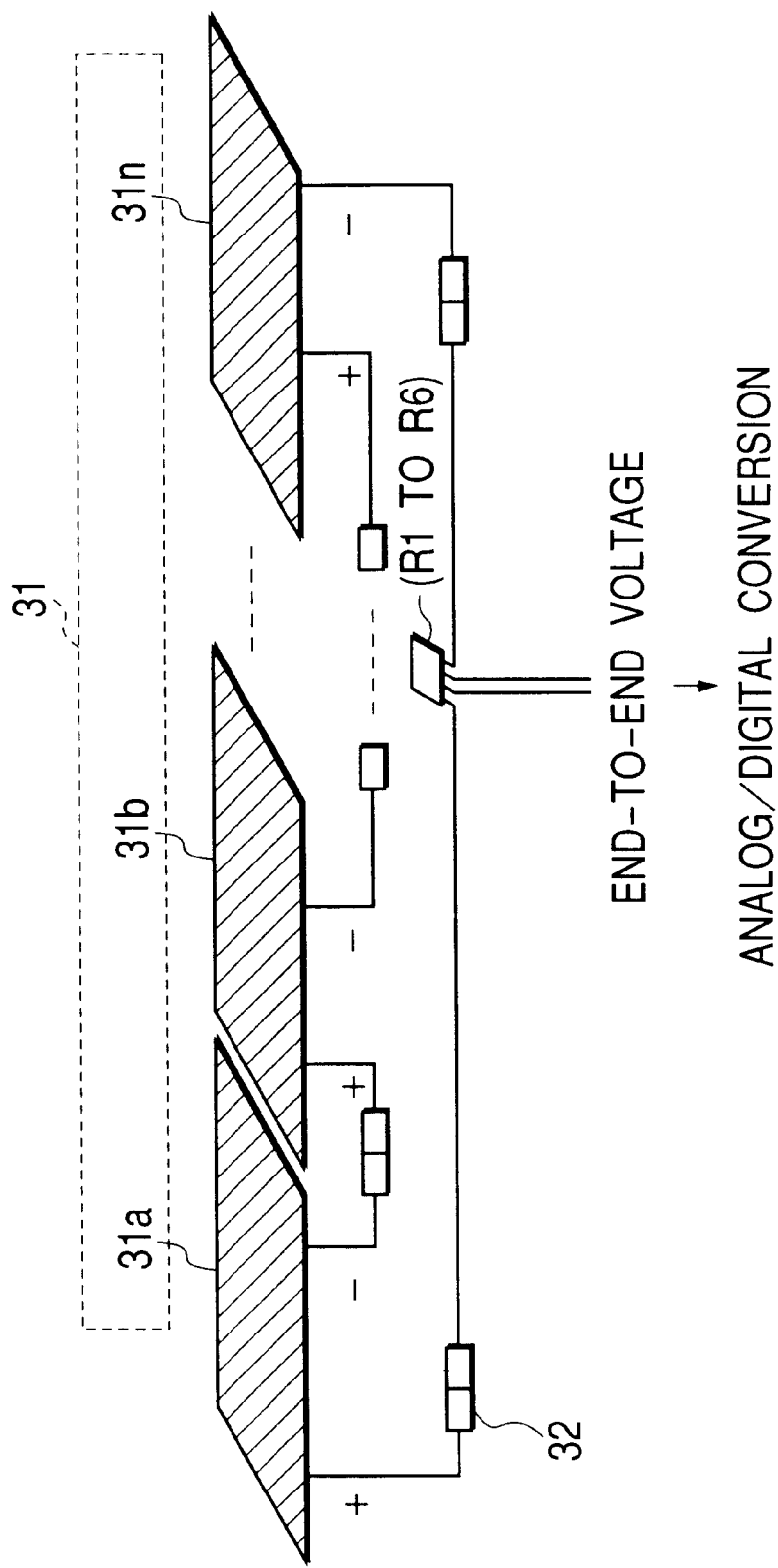
FIG. 16 is a drawing for explaining human shadow sensors in the photovoltaic power generation system according to the second embodiment and Example 6 of the present invention.

In the second embodiment there are six sensors 12 ($12a$ to $12f$) located around the solar cell array 11. These sensors are constructed by connecting positive and negative terminals of solar cells ($31a$ to $31n$) directly or through connector 32, as shown in FIG. 16. Electric resistors (e.g., shunt resistors R) (R1 to R6) are connected to the positive and negative terminals of a plurality of series cells. Then, an operating current of the solar cells is detected as a value of voltage at the both ends (simply referred to as "end-to-end voltage") of the shunt resistors R. The solar cells being the sensors in the second embodiment can be either of silicon solar cells of the crystalline type or the amorphous type (including the microcrystalline type).

The sensors are not limited, particularly, to the solar cells, but can be any sensors that can detect an access of a man to the solar cell array and that can output a signal indicating the detection.

Figure 17:
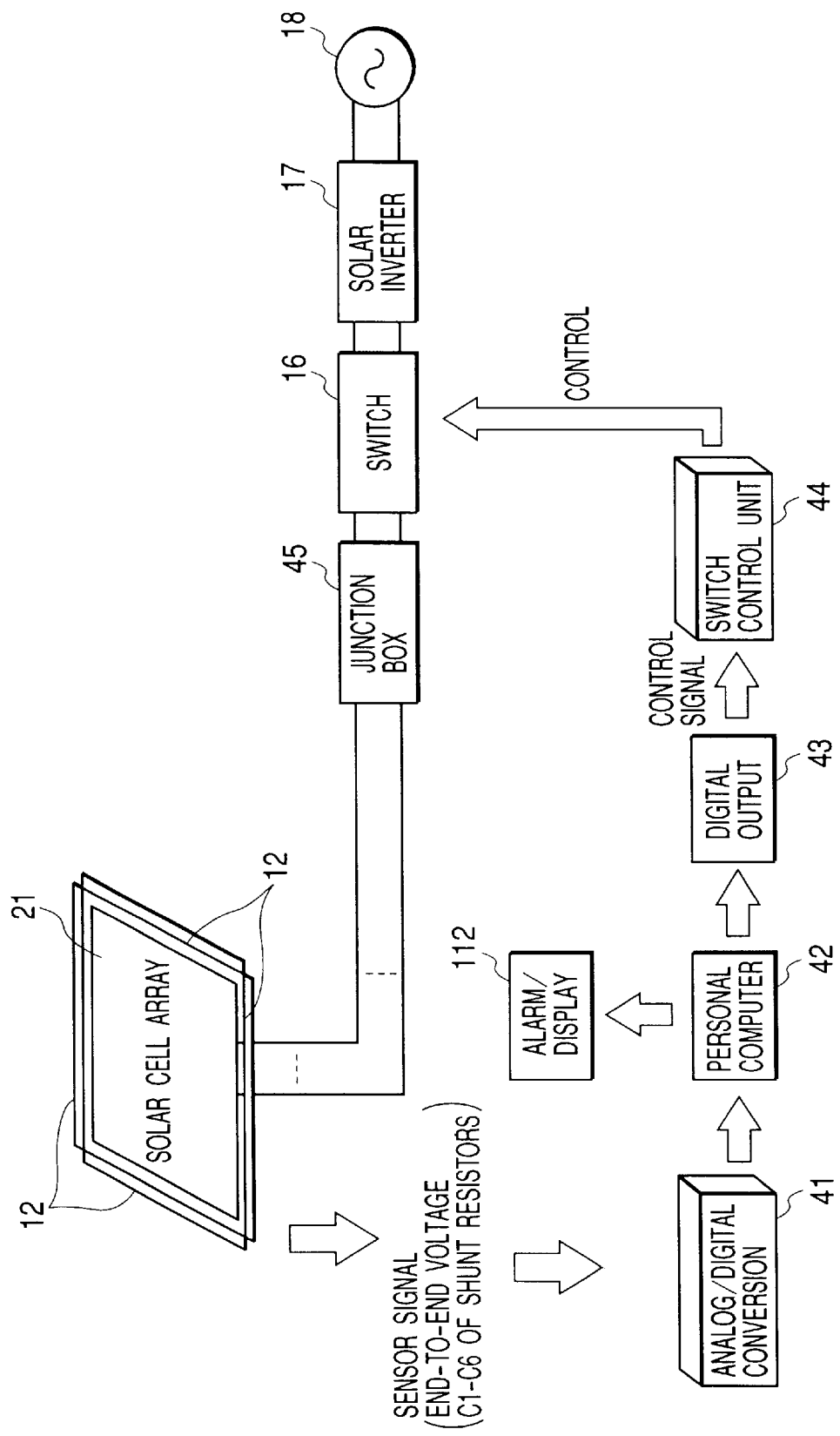
FIG. 17 is a drawing for explaining a method of controlling the photovoltaic power generation system according to the second embodiment and Example 6 of the present invention.

The control method of the photovoltaic power generation apparatus (photovoltaic power generation system) in the present embodiment will be described referring to FIG. 17. The switch 13 for power generation system, the reverse current preventing diode 14, and the main switch 15 are built in the junction box 45.

As the current detecting means of human shadow sensors, voltages at the both ends of R1 to R6 are supplied as C1 to C6, respectively, through the shunt resistors R1 to R6 to an analog/digital converter 41, thereby measuring signals of the sensors. The system is configured then to perform measurement and calculation of current signals of the sensors, compare signal values of the respective sensors, and determine that a man comes to near the array and casts its shadow if either signal value has a deviation of not less than a predetermined value (the details of which will be described hereinafter).

A switch control unit 44 for controlling the switch 16 of the solar cell array is constructed to energize a photocoupler of the switch control unit 44 through a digital output 43 from a personal computer 42, perform switching of on/off of an external dc power supply, and control supply and stop of voltage for switching to the switch 16 of a dc electromagnetic contactor. Then, the switching state of the switch 16 is retained before a release operation is carried out. The above release operation can be done manually or automatically.

Third Embodiment

The third embodiment presents another embodiment of the control method of the photovoltaic power generation apparatus (photovoltaic power generation system) according to the present invention. In the present embodiment the components substantially identical to those in the second embodiment will be denoted by the same reference symbols and detailed description thereof will be omitted.

Figure 19:
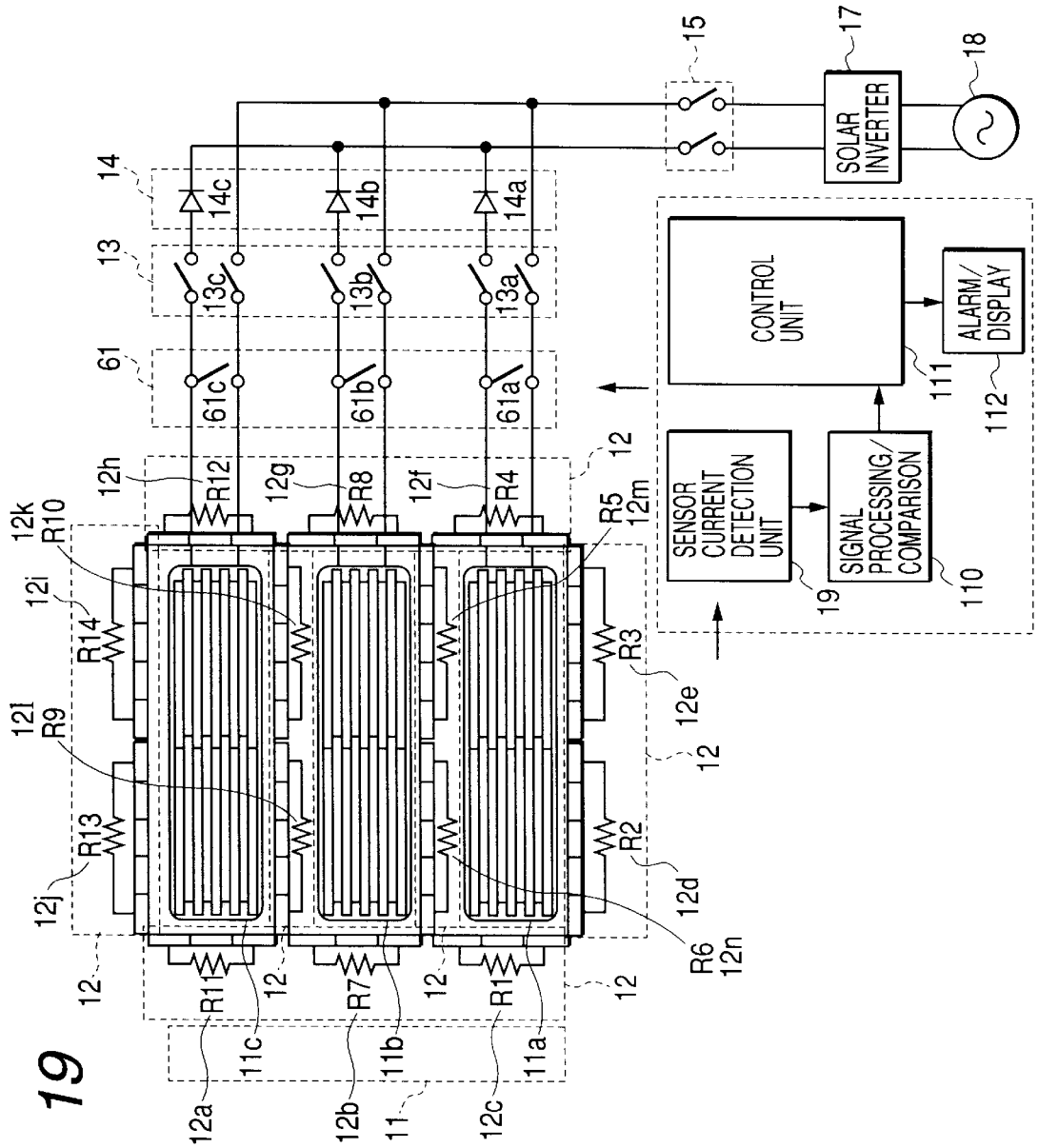
FIG. 19 is a block diagram of a photovoltaic power generation system according to the third embodiment and Example 7 of the present invention.
Figure 20:
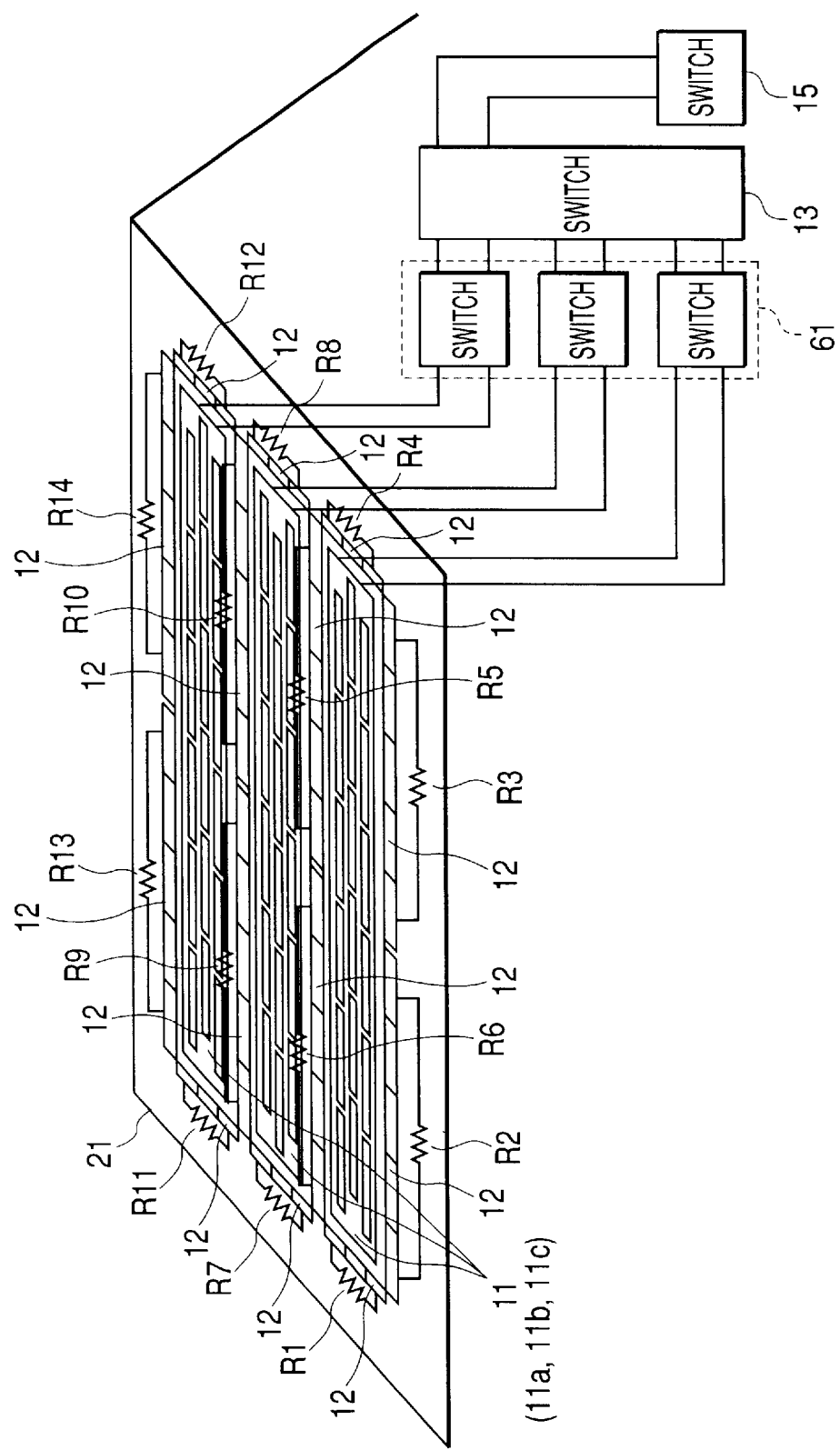
FIG. 20 is a block diagram showing a roof configuration of the photovoltaic power generation system according to the third embodiment and Example 7 of the present invention.
Figure 21:
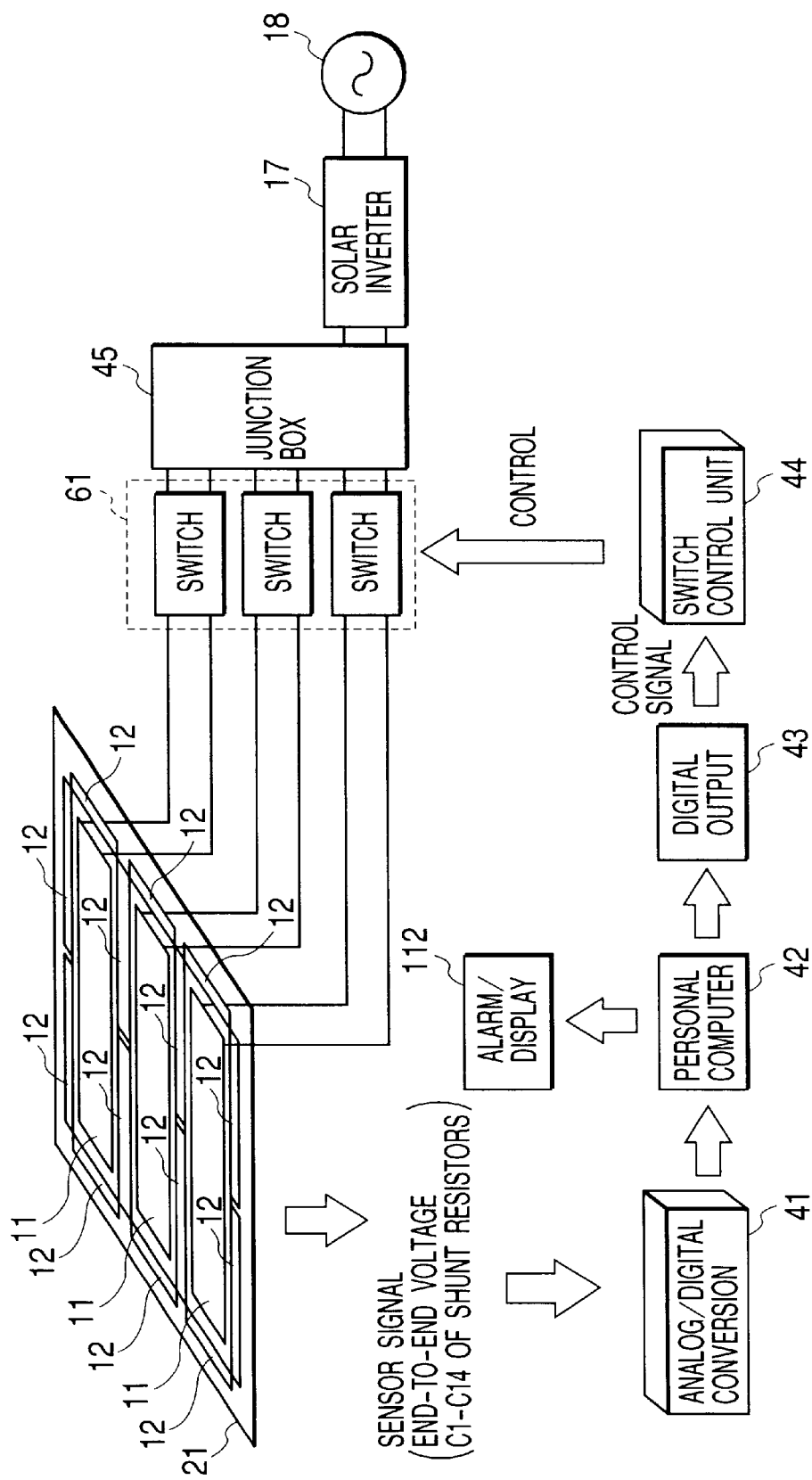
FIG. 21 is a drawing for explaining a method of controlling the photovoltaic power generation system according to the third embodiment and Example 7 of the present invention.

In the photovoltaic power generation system of the present embodiment, the sensors ($12a$ to $12n$) are not laid only around the solar cell array, but also laid around the string units, as shown in FIG. 19 to FIG. 21, based on the structure of the photovoltaic power generation system of the second embodiment. Then, the short-circuit condition, described in the second embodiment, is modified herein so that a short circuit is established for only a string corresponding to a sensor judged as detecting a human shadow, different from the condition that a short circuit is established for the array of the photovoltaic power generation system as in the second embodiment. In the present embodiment, therefore, the strings without access of a man or the like can continue generating power without waste. This structure permits the sensors to be used as human shadow sensors.

In the photovoltaic power generation system of the present embodiment, the sensors ($12a$ to $12n$) are arranged around the solar cell strings as shown in FIG. 20 and FIG. 21, based on FIG. 19, as against the photovoltaic power generation system of the second embodiment. The sensors are constructed as shown in FIG. 16 of the second embodiment. Voltages C1 to C14 at the both ends of the shunt resistors of R1 to R14 are inputted into the analog/digital converter 41 to detect operating currents of the sensors (solar cells) as values of the voltages at the both ends of the shunt resistors. The system is arranged then to perform the measurement and calculation of current signals of the sensors, compare the signal values of the respective sensors, and determine that a person comes to near the array and casts a shadow onto the array if there is a deviation of not less than a predetermined value (the details of which will be described hereinafter). This structure permits the sensors to be used as human shadow sensors.

The switch control unit 44 for controlling a string shorting switch 61 of dc electromagnetic contactor is configured to energize a photocoupler of the switch control unit 44 for an objective string through the digital output 43 from the personal computer 42, perform switching of the external dc power supply, supply a voltage to the string shorting switch 61, short the switch 61, and short a string corresponding to the sensor judged as sensing that a person approaches the array and casts a shadow. Then, the switching state of the string shorting switch 61 is retained before a release operation is carried out. The above release operation can be done manually or automatically.

The present invention will be detailed hereinafter with examples thereof, but it should be noted that the present invention is by no means intended to be limited to these examples.

EXAMPLE 1

The present example is an example of a photovoltaic power generation system in which the detecting means detects presence of an intruder intruding into a restricted area including the solar cell installation area surrounded by a wall and in which, at the same time as it, the electric shock preventing means is activated to prevent the intruder from receiving an electric shock.

Figure 2:
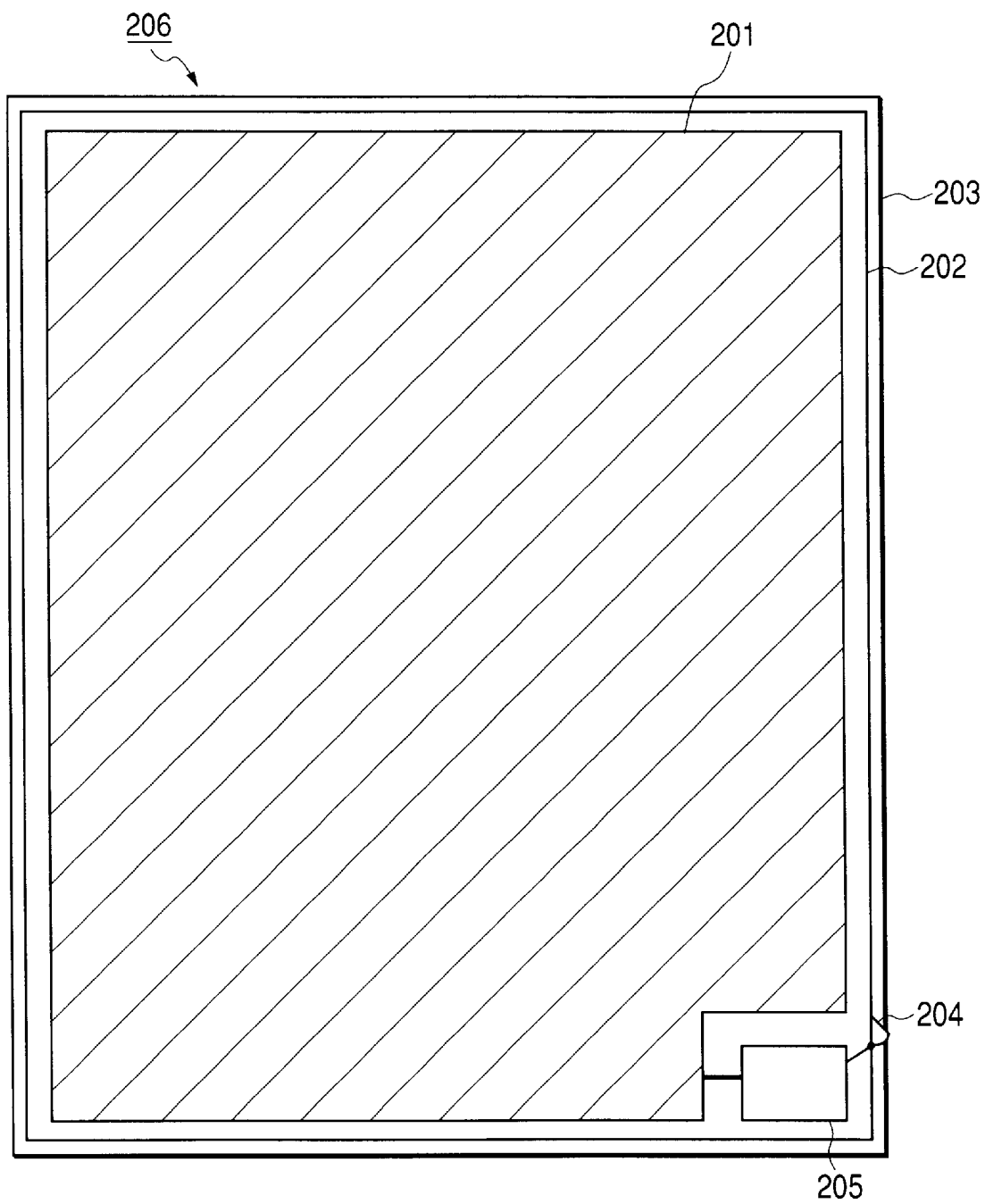
FIG. 2 is a layout drawing of a photovoltaic power generation system according to Example 1 of the present invention.

FIG. 2 shows the photovoltaic power generation system of the present example and is a layout drawing of the photovoltaic power generation system 206 consisting of the restricted area 202 including the solar cell installation area 201, a wall (intrusion preventing means) 203 for preventing intrusion of an intruder, which surrounds the periphery of the restricted area 202, a door 204 for access to the restricted area, formed in part of the wall 203, and a building 205 incorporating devices necessary for the photovoltaic power generation system. Inside the building 205 there are provided the junction box for connecting the solar cell strings in parallel, the inverter for converting a dc power, generated by the solar cells, to an ac power, and so on.

Figure 3:
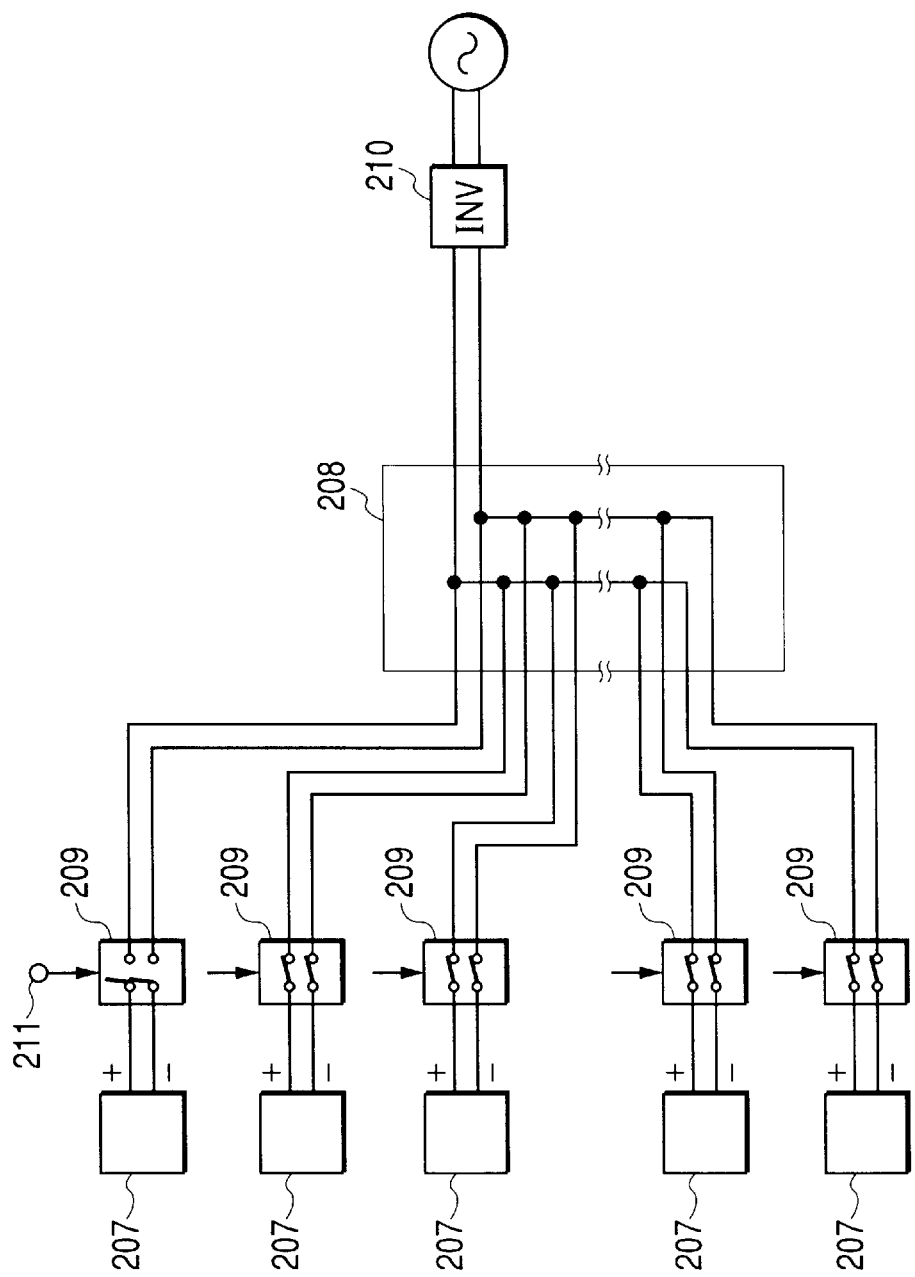
FIG. 3 is a circuit diagram of the photovoltaic power generation system according to Example 1 of the present invention.

FIG. 3 is a circuit diagram of the photovoltaic power generation system of the present example. In the present example, provided inside the building 205 are the junction box 208 for connecting the solar cell strings 207 in parallel, the inverter 210 for converting the dc power generated by the solar cell array, to the ac power, and so on. An interlock mechanism is used as means for preventing an intruder from receiving an electric shock (electric shock preventing means). When an intruder opens the door 204 communicating with the interior of the restricted area 202, a signal from a sensor 211 mounted on the door 204 activates relay switches 209 provided for the respective solar cell strings 207 for shorting the solar cell strings 207. This structure prevents the intruder from receiving an electric shock even if the intruder touches the live portion of the photovoltaic power generation system. This allows the detection of the intruder intruding into the restricted area being a hazard controlled area and also allows the prevention of the electric shock on the intruder at the same time. This structure obviates the need for the manager or the person concerned to always monitor the system and permits reduction in the number of guards, thereby reducing the cost. In addition, the system can be quickly returned to the normal operation after confirmation of safety.

Figure 5:
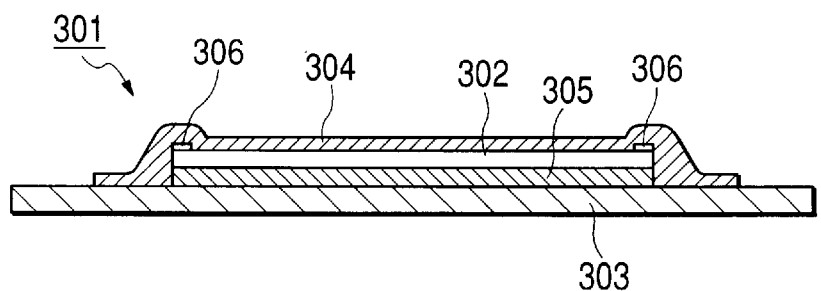
FIG. 5 is a cross-sectional view of the solar cell module used in the photovoltaic power generation system according to Example 1 of the present invention.

FIG. 4A is a block diagram of solar cell modules 301 used in the photovoltaic power generation system of the present example, FIG. 4B a circuit diagram showing a state of normal power generation in the photovoltaic power generation system of the present example, and FIG. 4C a circuit diagram showing a state in which the sensor mounted on the door detects an intruder and in which the relay for shorting the solar cell string is activated in order to prevent the intruder from receiving an electric shock upon the detection. FIG. 5 is a cross-sectional view along 5—5 in FIG. 4A.

The solar cell modules 301 used in the present example are of a structure consisting of a metal back reinforcement 303, an insulating sheet 305, amorphous silicon solar cells 302, interconnectors 306, and adhesive protecting films 304 stacked in order. The adhesive protecting film 304 is laid in the range from the surface of each amorphous silicon solar cell 302 to the surface of the metal back reinforcement 303, so as to secure the amorphous silicon solar cell 302 and insulating sheet 305 to the metal back reinforcement 303.

The solar cell modules 301 constituting the solar cell strings are constructed in the structure in which only the amorphous silicon solar cells 302 are covered one by one with the coating (adhesive protecting film 304) and in which the interconnectors 306 between the cells are exposed in part as live portions. Silicone sealants 307 are provided on tab wire portions, into which water can intrude, at ends of the coatings, thereby composing a structure of enhancing waterproof.

In the photovoltaic power generation system of the present example, when an intruder is detected, the predetermined photovoltaic strings are shorted by the relay switches 209 provided for the respective solar cell strings and activated by the signal from the sensor. This results in providing no portion with a high voltage in each part of the solar cell strings and eliminates the possibility of electric shock on the intruder even if the intruder should touch the live portions. In addition, it is feasible to restore the normal operation to the photovoltaic power generation system immediately by returning the relay switches 209 to the original state by the manager after confirmation of safety and to reduce power generation loss to a minimum.

By making use of the extra environment condition that the solar cells are located in the restricted area in this way, the materials making the solar cell modules can be minimized whereby the cost can be reduced remarkably. If a solar cell module is broken, it can be readily replaced with another module.

EXAMPLE 2

Figure 6:
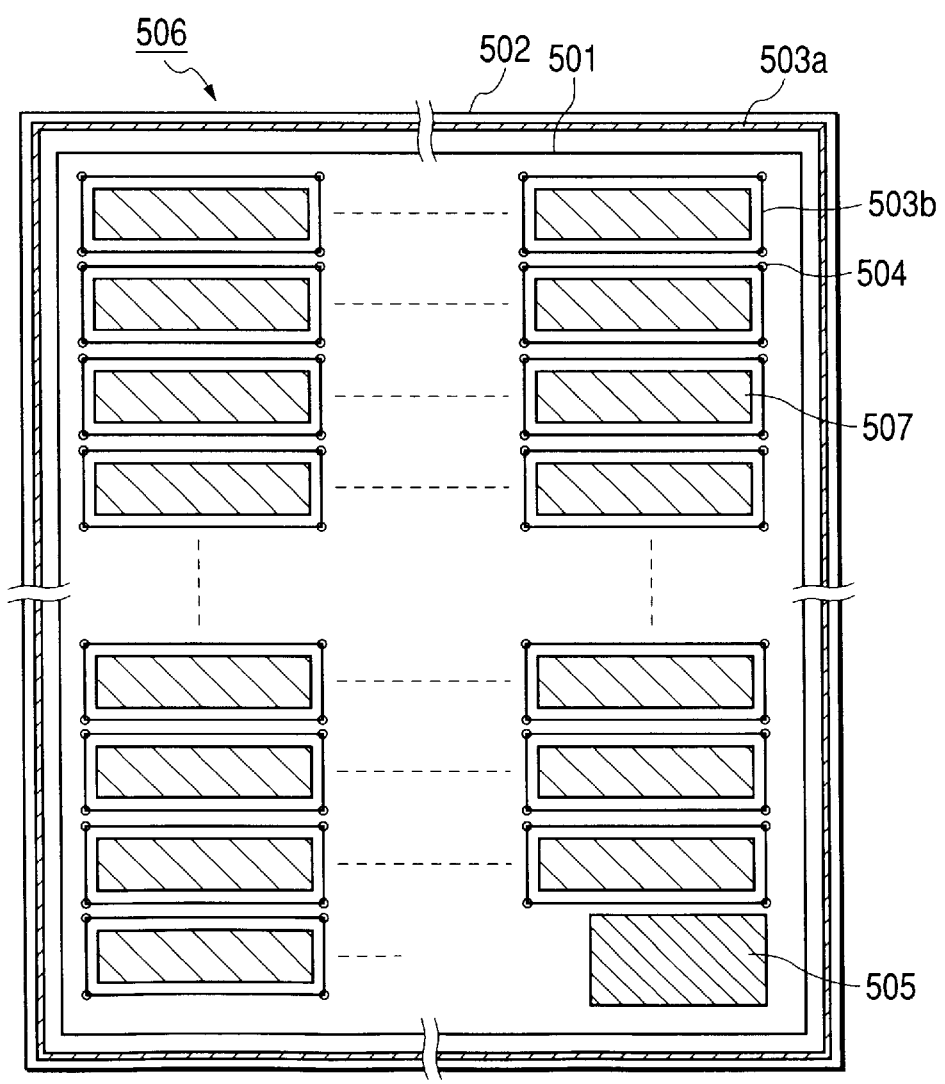
FIG. 6 is a layout drawing of a photovoltaic power generation system according to Example 2 of the present invention.

The present example is an example of a photovoltaic power generation system, as shown in FIG. 6, in which when an intruder intrudes into the restricted area including the solar cell installation area surrounded by double fences (intrusion preventing means), a plurality of vibration sensors located on the inside fences the double fences detect the existence of the intruder and in which, at the same time as it, the relay switch (electric shock preventing means) for shorting solar cells is activated to prevent the intruder from receiving an electric shock.

Figure 7:
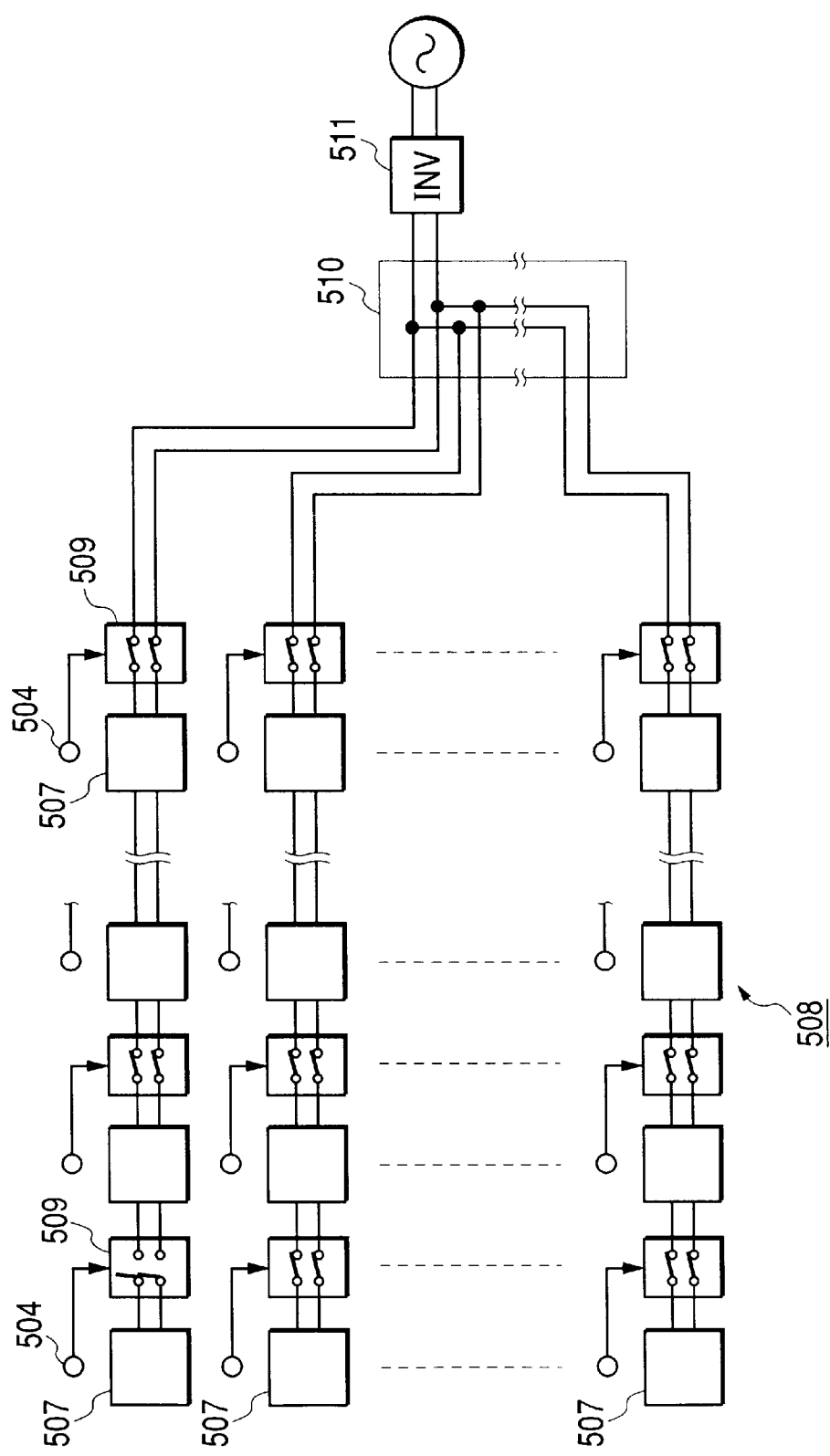
FIG. 7 is a circuit diagram of the photovoltaic power generation system according to Example 2 of the present invention.

FIG. 6 shows the photovoltaic power generation system of the present example and is a layout drawing of the photovoltaic power generation system 506 consisting of the solar cell installation area 501, the restricted area 502 including the solar cell installation area 501, the double fences (503a, 503b) for preventing an intruder from intruding into the restricted area 502, the vibration sensors 504 placed on the inside fences 503b of the double fences, and the building 505 incorporating the junction box, the inverter, etc. necessary for the photovoltaic power generation system. FIG. 7 is a circuit diagram of the photovoltaic power generation system of the present example.

The control circuit of the photovoltaic power generation system 506 of the present example is composed of a plurality of vibration sensors 504 mounted on the inside fences 503b and detecting an intruder, relay switches 509 activated by a signal outputted when the vibration sensor 504 detects an intruder, the junction box 510 for connecting the solar cell strings 508, each consisting of series solar cell modules 507, in parallel, and the inverter 511 for converting the dc power generated by the solar cells, to the ac power.

Since the solar cell modules used in the present example are of the structure similar to that of those used in Example 1, the description thereof is omitted herein.

The provision of the double fences as in the present example makes it difficult for an intruder attempting to intrude, to intrude into the restricted area being a hazard controlled area, and the provision of the vibration sensors 504 on the inside fences 503b of the double fences makes it feasible to decrease malfunctions upon detection of intruder. Further, since the relay switches 509 short the solar cell modules 507 at the same time as the detection of the intruder by the vibration sensor, the intruder can be prevented from receiving an electric shock. Since the relay switches 509 are provided for the respective solar cell modules, it is also possible to short only the solar cell modules near the vibration sensor detecting the intruder. Besides, the manager or the person concerned does not have to always monitor the system and the number of guards can be reduced, thereby permitting reduction of cost. It is also feasible to restore the normal operation to the system quickly by returning the relay switches shorting the solar cell modules, to the original state after confirmation of safety.

EXAMPLE 3

The present example is an example of a photovoltaic power generation system in which a plurality of infrared sensors disposed along the periphery detect the presence of an intruder attempting to intrude into the restricted area including the solar cell installation area surrounded by a fence and a ditch filled with water (intrusion preventing means) and in which switches for establishing open circuits of the solar cells (electric shock preventing means) are activated in synchronism therewith whereby the intruder is prevented from receiving an electric shock.

Figure 8:
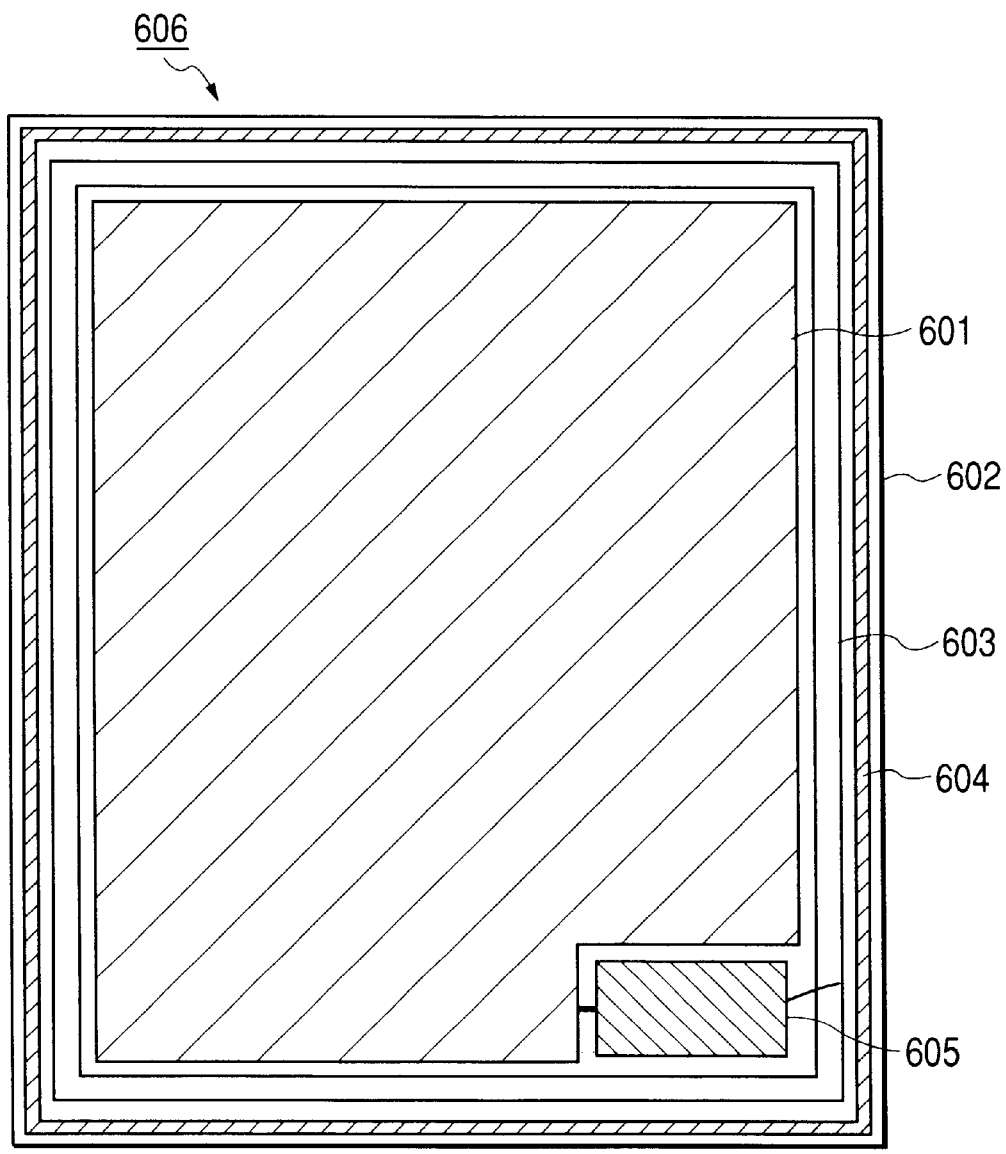
FIG. 8 is a layout drawing of a photovoltaic power generation system according to Example 3 of the present invention.

FIG. 8 shows the photovoltaic power generation system of the present example and is a layout diagram of the photovoltaic power generation system 606 consisting of the solar cell installation area 601, the restricted area 602 including the solar cell installation area 601, the fence 603 and the ditch 604 filled with water for preventing a person except for the manager from intruding into the restricted area 602, and the building 605 incorporating the equipment and facilities such as the inverter, the junction box, etc. necessary for the photovoltaic power generation system.

In the photovoltaic power generation system of the present example, an infrared sensor for detecting intrusion of an intruder into the restricted area is provided for each post of the fence 603, and the system is constructed in structure in which once either infrared sensor detects an intruder, it issues a signal and, at the same time as it, the solar cell opening switches provided for the respective solar cells operate in synchronism therewith to prevent the intruder from receiving an electric shock. Since the ditch 604 is filled with water, it can prevent the intrusion of intruder into the restricted area being a hazard controlled area and also prevent growing of trees and plants which can make a shadow possibly affecting the power generation of the photovoltaic power generation system. Further, the infrared sensors can detect the intrusion of intruder day and night and the switches for establishing open circuits of the solar cells operate at the same time as the detection of intruder by the infrared sensors, whereby the intruder can be prevented from receiving an electric shock. The manager or the person concerned does not have to always monitor the system and the number of guards can be reduced, thereby permitting reduction of cost. It is also possible to return the system to the normal operation quickly after confirmation of safety.

Figure 9A:
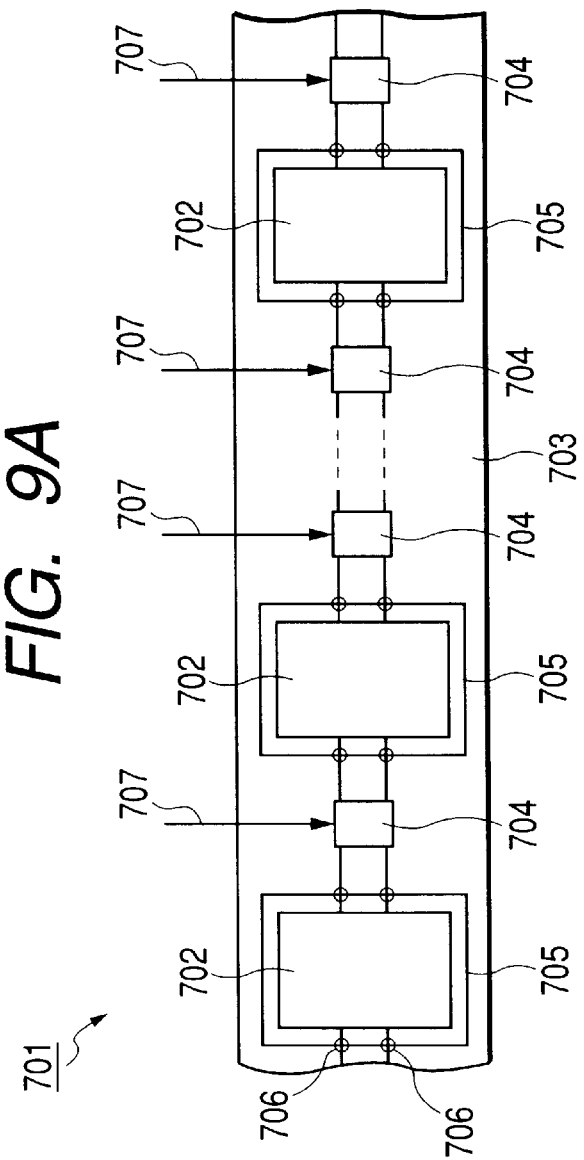
Figure 9C:
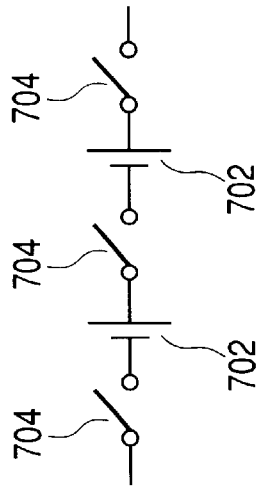
Figure 9B:
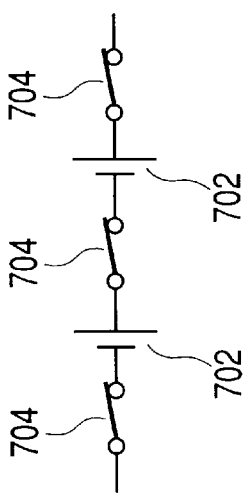

FIG. 9A is a block diagram of the solar cell modules 701 used in the photovoltaic power generation system of the present example, FIG. 9B a circuit diagram showing a state of normal power generation in the photovoltaic power generation system of the present example, and FIG. 9C a circuit diagram showing a state in which when a proximity sensor detects an intruder, the relays for shorting the solar cells are activated in order to prevent the intruder from receiving an electric shock.

Each of the solar cell modules 701 used in the photovoltaic power generation system of the present example is composed of solar cells 702, a back reinforcement 703, relay switches 704, coatings 705, and silicone sealants 706.

In the photovoltaic power generation system of the present example, when detecting an intruder, the proximity sensor emits a signal 707 to activate the relay switches 704 disposed between the solar cells and establish short circuits of the solar cells, thereby preventing the intruder from receiving an electric shock. The solar cells 702 are covered one by one with the coating 705 and the live portions between the solar cell modules are exposed in part. The silicone sealants 706 are provided on the tab wire portions, into which water can intrude, at ends of the coatings 705, thereby constituting the structure of enhancing waterproof. This makes it feasible to readily detect a defective solar cell by making use of the exposed parts of the live portions.

The control method of the photovoltaic power generation system of the present example eliminates the possibility of an electric shock on the intruder even if the intruder should touch the live portions, and can also restore the normal operation to the photovoltaic power generation system immediately by returning the relays (electric shock preventing means) to the original state after confirmation of safety, thereby controlling the power generation loss to a minimum.

EXAMPLE 4

The present example is an example of a photovoltaic power generation system which is provided with proximity sensors placed in the solar cell installation area in the system and relay switches (electric shock preventing means) for shorting solar cells at both ends of each series of solar cells within a safety voltage and which is arranged to detect an intruder by the proximity sensors and activate the relay switches in synchronism with the proximity sensors whereby the intruder is prevented from receiving an electric shock.

Figure 10:
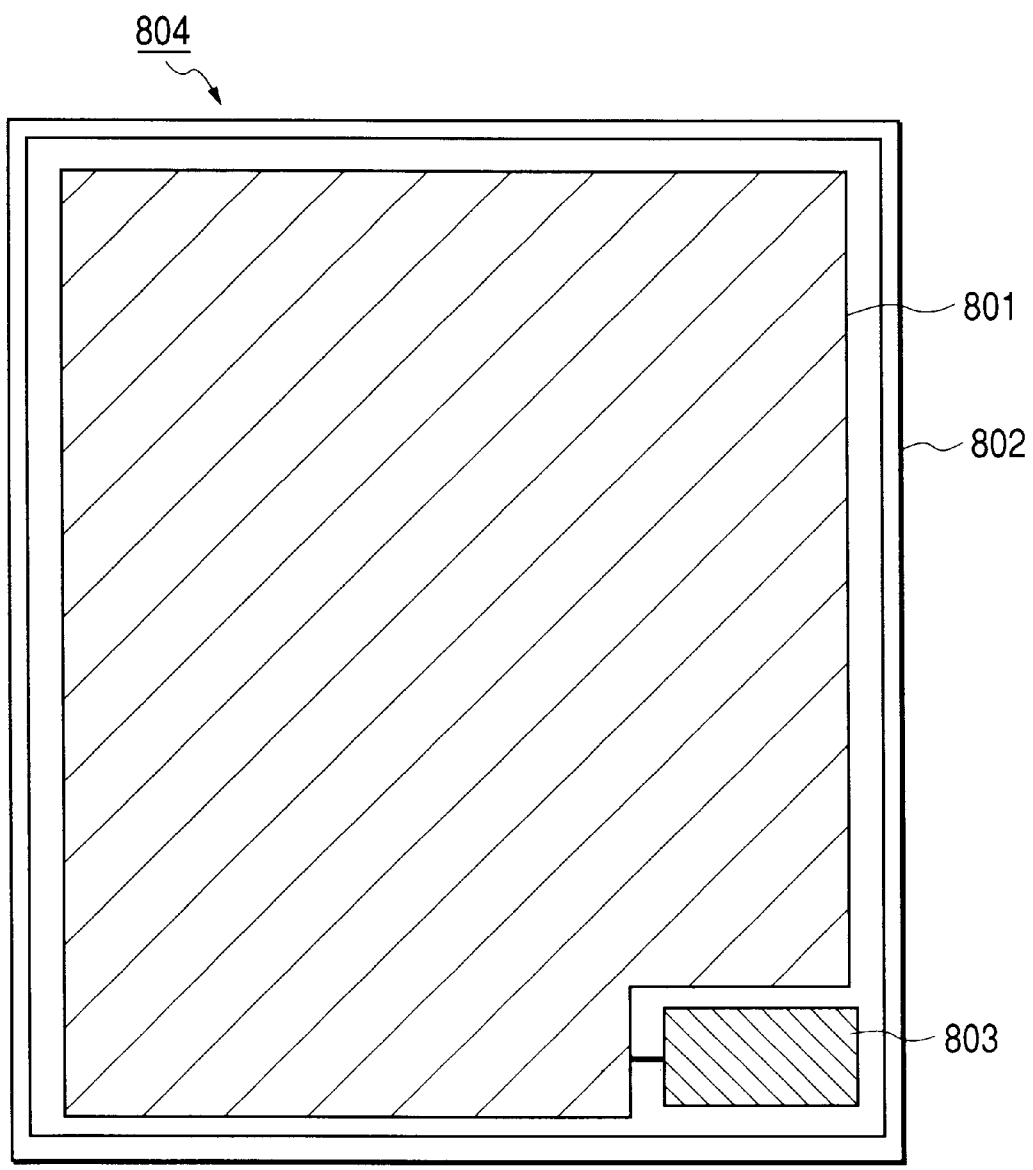
FIG. 10 is a layout drawing of a photovoltaic power generation system according to Example 4 of the present invention.

FIG. 10 shows the photovoltaic power generation system of the present example and is a layout diagram of the photovoltaic power generation system 804 consisting of the solar cell installation area 801, the restricted area 802 including the solar cell installation area 801, and the building 803 incorporating the equipment and facilities such as the inverter, the junction box, etc. necessary for the photovoltaic power generation system.

The control circuit of the photovoltaic power generation system of the present example is composed of the relay switches for shorting the solar cell strings, the proximity sensors, the junction box for connecting the solar cell strings in parallel, and the inverter for converting the dc power generated by the solar cell array, to the ac power.

The photovoltaic power generation system of the present example is constructed in such structure that when the proximity sensor detects an intruder, the relay switches for establishing short circuits of the solar cells, disposed in the solar cell modules, are activated by a signal emitted from the proximity sensor to bring the solar cells into a short-circuit state whereby the intruder is prevented from receiving an electric shock.

FIG. 11A is a block diagram of the solar cell module 901 used in the photovoltaic power generation system of the present example, FIG. 11B a circuit diagram showing a state of the normal power generation in the photovoltaic power generation system of the present example, and FIG. 11C a circuit diagram showing a state in which when the proximity sensor detects an intruder, the relays for shorting the solar cell strings are activated in order to prevent the intruder from receiving an electric shock.

Each of the solar cell modules 901 used in the photovoltaic power generation system of the present example consists of solar cells 902, a back reinforcement 903, relay switches 904, coatings 905, and silicone sealants 906.

In the photovoltaic power generation system of the present example, when detecting an intruder, the proximity sensor issues a signal to activate the relay switches 904 provided at both ends of each series of three solar cells 902 to short the solar cells 902 whereby the intruder is prevented from receiving an electric shock. The solar cells are covered one by one with the coating 905 and the live portions between the solar cell modules are exposed in part. Since water can intrude into the ends of the coatings, the tab wire portions thereof are sealed with the silicone sealants 906, thereby forming the structure of enhancing waterproof. This makes it feasible to readily detect a defective solar cell by making use of the exposed parts of the live portions. Even if an intruder should touch the live portions there would be no possibility of an electric shock. Besides, it is also feasible to restore the normal operation to the photovoltaic power generation system immediately by returning the relays (electric shock preventing means) to the original state after confirmation of safety, and thereby control the power generation loss to a minimum.

EXAMPLE 5

The present example is an example in which the intruder is detected by the proximity sensors provided for the respective solar cell modules in the solar cell installation area in the photovoltaic power generation system, solar cell opening switches, and blocking diodes to prevent the intruder from receiving an electric shock.

Figure 12:
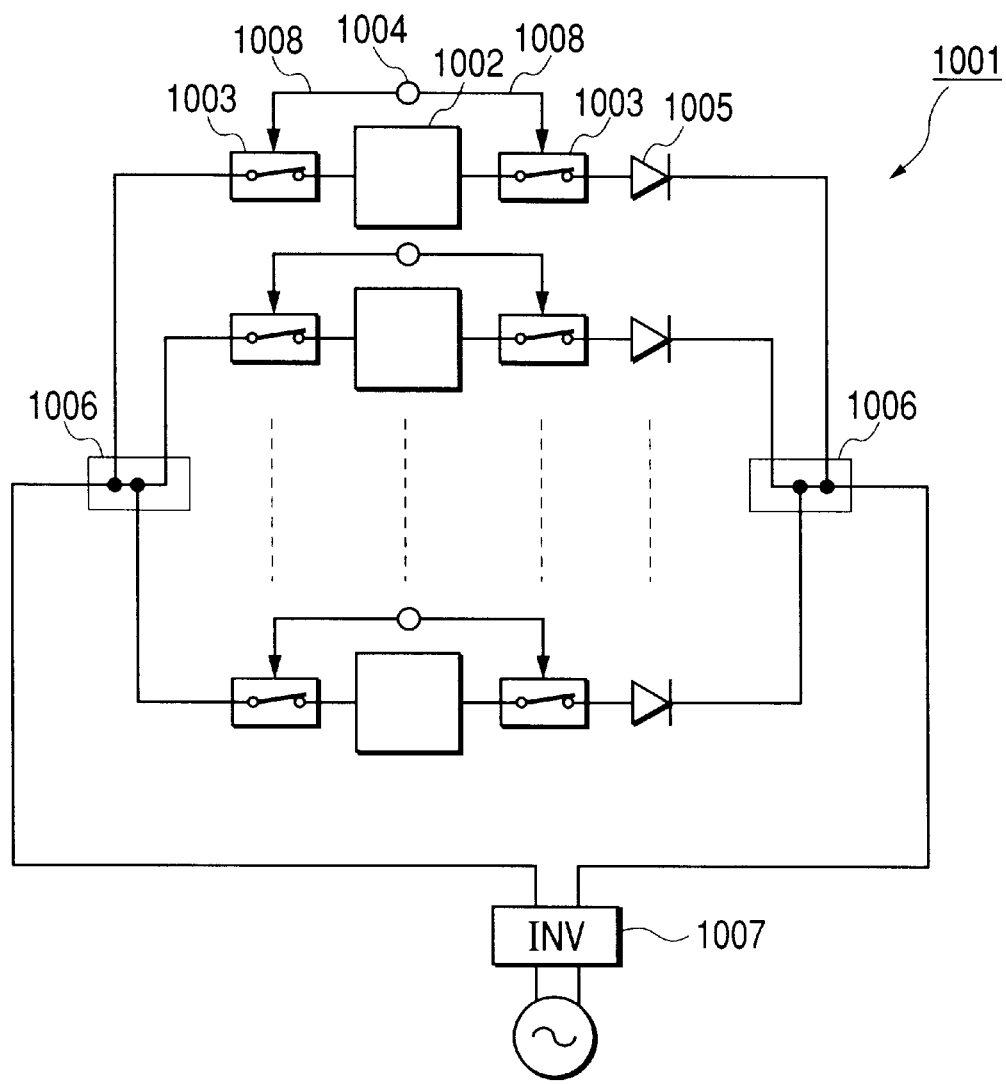
FIG. 12 is a circuit diagram of a photovoltaic power generation system according to Example 5 of the present invention.

FIG. 12 is a circuit diagram of the photovoltaic power generation system of the present example and is a circuit diagram of the photovoltaic power generation system 1001 consisting of the solar cell modules 1002, the solar cell opening switches 1003, the proximity sensors 1004, the blocking diodes 1005, the junction box 1006 for connecting the solar cell modules 1002 in parallel, and the inverter 1007 for converting the dc power generated by the solar cell array, to the ac power.

In the photovoltaic power generation system of the present example, when detecting an intruder, the proximity sensor 1004 emits signals 1008 to activate the solar cell opening switches 1003 provided for each solar cell module 1002 to bring the solar cell module 1002 into an open-circuit state whereby the intruder is prevented from receiving an electric shock. On that occasion, since the blocking diode 1005 is provided for each of the solar cell modules 1002, electricity generated by the other solar cell modules 1002 connected in parallel is prevented from flowing backward into the solar cell module 1002 brought into the open-circuit state. This eliminates the risk to the human body due to an electric shock even if the intruder should touch the live portions of the solar cell module. Further, since only the solar cell module proximate to the intruder is brought into the open-circuit state, the power generation loss can be minimum.

Figure 13:
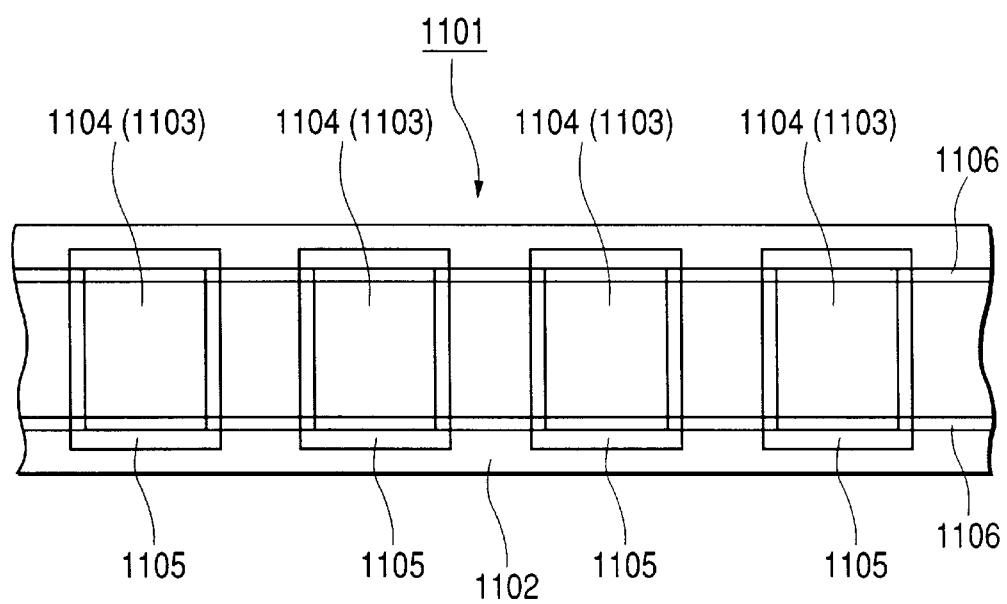
FIG. 13 is a block diagram of the solar cell module used in the photovoltaic power generation system according to Example 5 of the present invention.

FIG. 13 is a view showing the solar cell module used in the photovoltaic power generation system of the present example. The solar cell module 1101 is of a layer structure consisting of a back reinforcement 1102, insulating sheets 1103 placed on the back surfaces of the solar cells 1104, the solar cells 1104, and front coatings 1105. The electricity generated by the solar cells 1104 is extracted through lead wires 1106 and the lead wires 1106 are exposed in part without the front coatings 1105 to leave the live portions in an exposed state.

In the present example, the back reinforcement 1102 is a steel sheet, the insulating sheets 1103 PET sheets, the solar cells 1104 amorphous silicon solar cells, the front coatings 1105 polyethylene protective sheets, and the lead wires 110176 copper films.

Use of the solar cell modules as in the present example enables to construct the photovoltaic power generation system at minimum material cost without affecting the power generation function.

EXAMPLE 6A

The present example is an example of a control method of the photovoltaic power generation apparatus (photovoltaic power generation system) of the present invention shown in FIG. 14 to FIG. 17 as described in the second embodiment.

In the photovoltaic power generation system of the present example, the solar cell array is constructed in the 16 series×3 parallel structure of Canon layered amorphous solar cell modules (Canon modules, trade name SR-02) and is laid on the roof 21 of the building. Namely, the total number of solar cells is 48, the maximum output operating voltage 176 V, the maximum output operating current 6.9 A, and the standard solar cell output at this time 1.2 kW in total (a measured value under AM 1.5, 1 Sun, and 25° C.).

The amorphous solar cells are used as the sensors (12a to 12f) around the solar cell array and the positive and negative terminals of a plurality of solar cells are connected directly or through a connector, as shown in FIG. 16. The shunt resistors (0.1 Ω, available from PCN) were connected to the positive and negative terminals of the plurality of cells connected in series. Then, a voltage at the both ends of each shunt resistor is calculated from a resistance of the shunt resistor and an electric current flowing therethrough and the voltage value is detected as a signal of the sensor.

The solar cells as the sensors in the present example can be either of silicon solar cells of the crystalline type or the amorphous type (including the microcrystalline type).

Particularly, the solar cells can be used as the sensors, but the sensors can be any sensors that can detect an access of a man to the solar cell array and that can output the detection as a signal.

The junction box 45 incorporating the photovoltaic-power-generation-system switch 13, the reverse current preventing diode 14, and the main switch 15 is a Canon junction box BX-02, and the solar inverter 17 a Canon inverter SI-04. The switch 16 for a short circuit or an open circuit between the terminals of the array is a dc electromagnetic contactor (DUD-A30, available from Mitsubishi). The solar inverter 17 is connected to the commercial ac system 18 of the house switchboard.

The solar cells in the present example may be of the crystalline type or the amorphous type (including the microcrystalline type). In Example 6A, all the strings in the photovoltaic power generation system face right south and are laid at the angle of inclination of 24.2°. As shown in FIG. 14, the solar cell strings in the present example are denoted as string 11$a$, string 11$b$, and string 11$c$ in the order named from the bottom.

The shunt resistors R1 to R6 are used as the current detecting means for detecting output currents of the sensors (solar cells). Voltages at the both ends of the shunt resistors R1 to R6 are calculated from resistances of the shunt resistors R1 to R6 and electric currents flowing there and are denoted by C1 to C6, respectively. They are inputted into the analog/digital converter 41 (ADM-676PCI, available from Microscience) to measure signals of the sensors. The current detecting means for detecting the currents of the sensors can also be other means, e.g., detection with clamp ammeters or the like, in addition to the shunt resistors. The personal computer 42 (FMV 5133D6 available from Fujitsu) is used for control of the analog/digital converter 41.

The switch control unit 44 for controlling the switch 16 of the array is configured to energize the photocoupler of the switch control unit 44 through the digital output 43 (DA12-16 available from CONTEC) from the personal computer 42, perform switching of on/off of the external dc power supply (AHC-100-24S available from Asia Electronics), and control the voltage supply and stop for switching to the switch 16 of the dc electromagnetic contactor.

In a state in which no shadow is cast onto the sensors (solar cells) and in which insolation intensity is sufficient or in a state in which insolation intensity is close to 1000 W/m$^2$, operating currents of the sensors (solar cells) are obtained as voltage values (which will be referred to hereinafter as "normal-state current signal values"). The normal-state current signal values are derived as follows.

First, an operating current value as a reference is measured in the above sensors (solar cells). Specifically, confirming that there is no obstacle at all around the photovoltaic power generation system, the magnitude of an electric current flowing in each sensor is measured in the state where the insolation intensity is sufficient or in the state where the insolation intensity is close to 1000 W/m$^2$.

Then, voltages at the both ends of the shunt resistors R1 to R6 are calculated from resistances of the shunt resistors and magnitudes of electric currents flowing there, and the voltage values are defined as normal-state current signal values as follows.

Normal-state current signal value of sensor 12$a$=Cpms1
Normal-state current signal value of sensor 12$b$=Cpms2
Normal-state current signal value of sensor 12$c$=Cpms3
Normal-state current signal value of sensor 12$d$=Cpms4
Normal-state current signal value of sensor 12$e$=Cpms5
Normal-state current signal value of sensor 12$f$=Cpms6

The following reference initial set values were used as set values for calculation in the control method of the photovoltaic power generation system of the present example.

(1) Sensor current comparison reference value D0=0.9

(2) Measurement interval T=1 sec
(3) Determination start reference value S=0.005
(4) Alarm output reference time T0=5 sec
(5) Normal-state current signal value of sensor 12$a$, Cpms1=0.228
(6) Normal-state current signal value of sensor 12$b$, Cpms2=0.225
(7) Normal-state current signal value of sensor 12$c$, Cpms3=0.226
(8) Normal-state current signal value of sensor 12$d$, Cpms4=0.225
(9) Normal-state current signal value of sensor 12$e$, Cpms5=0.224
(10) Normal-state current signal value of sensor 12$f$, Cpms6=0.225

Dispersion of the electric currents among the sensors can be corrected based on the measurement of the normal-state current signals of the human shadow sensors.

Figure 18A:
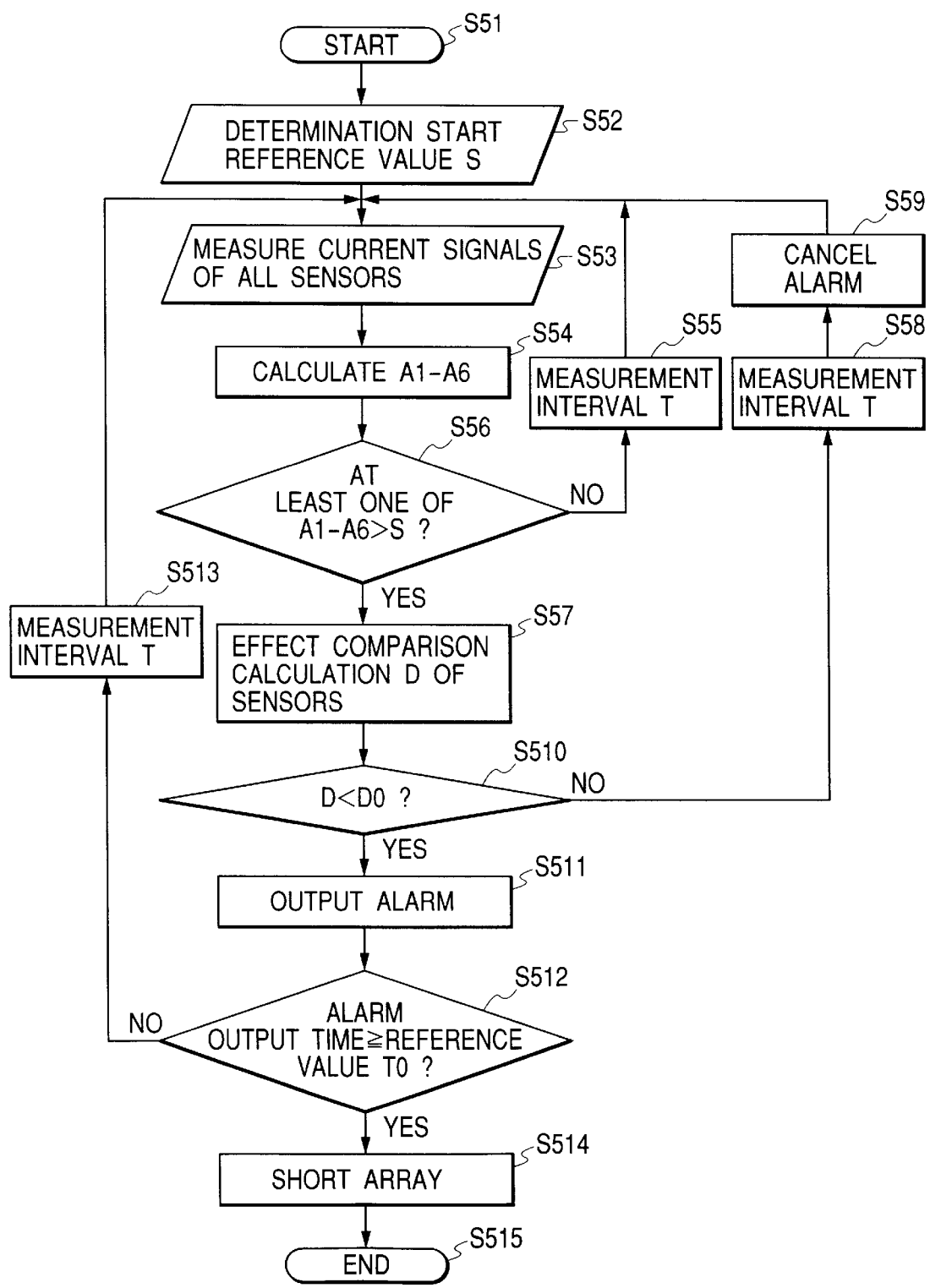
FIG. 18A is a flowchart for explaining a method of controlling the photovoltaic power generation system according to Example 6A of the present invention and FIG. 18B is a flowchart for explaining a method of controlling the photovoltaic power generation system according to Example 6B of the present invention.

A flowchart of the control method of the present example is presented in FIG. 18A.

First, the determination start reference value S is set (step S52) and the shunt resistors R1 to R6 are used as the current detecting means for detecting the operating currents of the sensors (solar cells). The voltages at the both ends of the shunt resistors R1 to R6 are calculated from the operating currents detected and the resistances of the shunt resistors through which the currents flow, and are denoted by C1 to C6, respectively (the operating currents of the sensors are detected as reduced voltage values). The voltages C1 to C6 are inputted at fixed intervals T (measurement intervals of 1 sec in the present example) into the analog/digital converter 41 (step S53). Then, the following calculations of A1 to A6 (Ax; x=1–6) are carried out using the measured end voltages C1 to C6, thereby normalizing the output signal values of the sensors (step S54).

A1=C1/Cpms1
A2=C2/Cpms2
A3=C3/Cpms3
A4=C4/Cpms4
A5=C5/Cpms5
A6=C6/Cpms6

When at least one of A1 to A6 (Ax; x=1–6) is larger than the determination start reference value S, the following sensor comparison calculation is carried out based on A1 to A6 (step S57).

Comparison Calculation of Sensors $D = (\text{minimum of } A1 \text{ to } A6)/(\text{maximum of } A1 \text{ to } A6)$ When all A1 to A6 are smaller than the determination start reference value S, the sensor comparison calculation is not carried out and the flow returns through a measurement interval T (step S55) to step S53.

In the present example the solar cells are used as sensors and during periods of no insolation in the nighttime or weak insolation, the provision of the determination start reference value S can prevent malfunctions such as an unwanted alarm output, an unwanted short circuit of the solar cell array, and so on. Namely, during periods without any risk in the photovoltaic power generation system, e.g., during periods of no insolation in the nighttime or during periods of small signals of the sensors under weak insolation, outputs of the sensors of the solar cells are also lowered and the sensors stop automatically. Therefore, the sufficient safety can be ensured in the simple structure and with less malfunctions by the combination of the two factors; use of the solar cells as sensors and setting of the determination start reference value.

Since the solar cells are used as the sensors while ensuring the sufficient safety, this configuration can also present a specific effect that an extra power supply or energy is not necessary for operating the sensors. Namely, the configuration of the present example can effectively utilize the feature that there is no need for emission of an alarm or a short circuit of the array during the periods without any risk in the photovoltaic power generation system, e.g., during periods of no insolation in the nighttime or during periods of small signals of sensors under weak insolation.

In the next place, when the calculated value D is smaller than the sensor current comparison reference value D0 (0.9 in the present example) (step S510), an alarm is issued first (step S511). In this case, an alarm is displayed on the screen of the personal computer 42, for example. Another alarm device may also be used instead of the display of the alarm on the screen of the personal computer.

In the present example, as described above, the control method is configured to perform the measurement of the current signals of the sensors and the calculations based thereon, compare the signal values of the respective sensors, and determine that a person comes to near the array and casts a shadow if there is a deviation of not less than the predetermined value.

Then, the current signals of the respective sensors are repeatedly measured continuously at the fixed intervals T (1 sec in the present example) and the comparison calculation of the sensors is carried out. When D is still smaller than the sensor current comparison reference value D0 even after the alarm output reference time T0 (5 sec in the present example) (step S512), the photocoupler of the switch control unit 44 is energized through the digital output 43 from the personal computer 42 to effect switching of the external dc power supply, supply the voltage to the switch 16 of the dc electromagnetic contactor, short the switch 16, and short the array (step S514).

Then, the switching state of the switch 16 of the dc electromagnetic contactor for shorting the array is retained before a release operation is performed. The release operation may be done manually or automatically.

EXAMPLE 6B

Figure 18B:
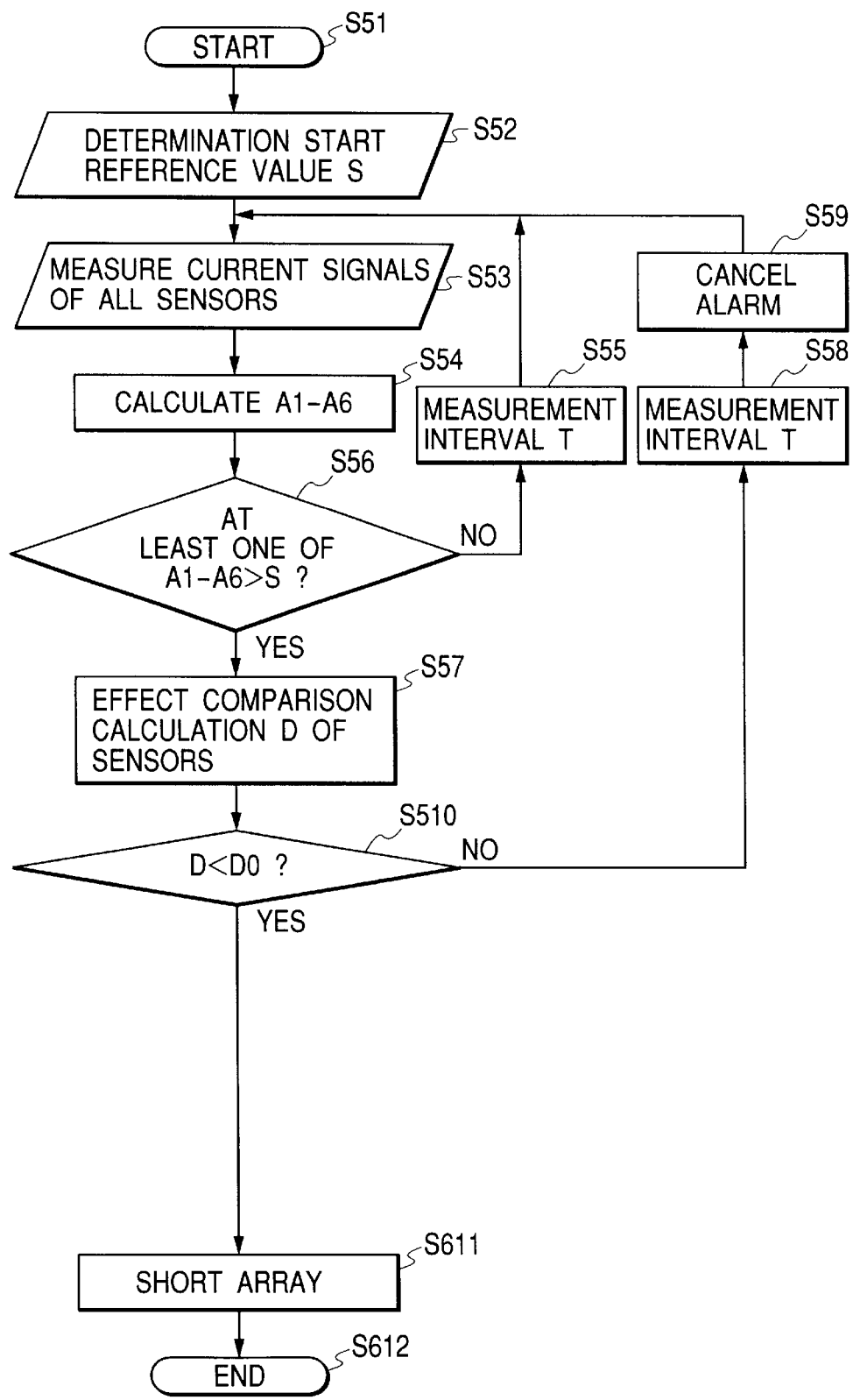

Example 6B is substantially the same as Example 6A except that the photovoltaic power generation system is controlled based on the flowchart shown in FIG. 18B.

Specifically, Example 6B is different from Example 6A in that when the calculated value D is smaller than the sensor current comparison reference value D0 (step S510), the array is shorted without output of an alarm (step S611). This configuration can also prevent the electric shock and thus ensure the safety while preventing the malfunctions such as the unwanted short circuit of the solar cell array and the like.

The configuration of Example 6A is more preferable in that a sudden halt of power generation can be avoided by output of an alarm (step S511 in FIG. 18A).

EXAMPLE 7A

The present example is an example of a control method of the photovoltaic power generation system of the present invention shown in FIG. 19 to FIG. 21 as described in the third embodiment.

In the photovoltaic power generation system of the present example, the sensors are not laid only around the array, but are also laid around the string units as shown in FIG. 19 to FIG. 21, based on the structure of the photovoltaic power generation system of Example 6A. Then, the short-circuit condition described in Example 6A is not that the array of the photovoltaic power generation system is shorted, but that only the string corresponding to the sensor detecting a human shadow is shorted.

In the photovoltaic power generation system of the present example, the sensors ($12a$ to $12n$) are laid around the strings of the solar cells. The sensors of solar cells are fabricated as the sensors, as shown in FIG. 16 of Example 6A.

The voltages C1 to C14 at the both ends of the shunt resistors R1 to R14 are inputted into the analog/digital converter 41 whereby the operating currents of the sensors (solar cells) are detected as voltage values.

The reference initial set values listed below were used as set values for calculation in the control method of the solar cell array of the present example.

(1) Sensor current comparison reference value D0=0.9
(2) Measurement interval T=1 sec
(3) Determination start reference value S=0.005
(4) Alarm output reference time T0=5 sec
(5) Normal-state current signal value of sensor $12a$, Cpms1=0.228
(6) Normal-state current signal value of sensor $12b$, Cpms2=0.225
(7) Normal-state current signal value of sensor $12c$, Cpms3=0.226
(8) Normal-state current signal value of sensor $12d$, Cpms4=0.225
(9) Normal-state current signal value of sensor $12e$, Cpms5=0.224
(10) Normal-state current signal value of sensor $12f$, Cpms6=0.225
(11) Normal-state current signal value of sensor $12g$, Cpms7=0.228
(12) Normal-state current signal value of sensor $12h$, Cpms8=0.225
(13) Normal-state current signal value of sensor $12i$, Cpms9=0.226
(14) Normal-state current signal value of sensor $12j$, Cpms10=0.225
(15) Normal-state current signal value of sensor $12k$, Cpms11=0.224
(16) Normal-state current signal value of sensor $12l$, Cpms12=0.225
(17) Normal-state current signal value of sensor $12m$, Cpms13=0.225
(18) Normal-state current signal value of sensor $12n$, Cpms14=0.225

Figure 22A:
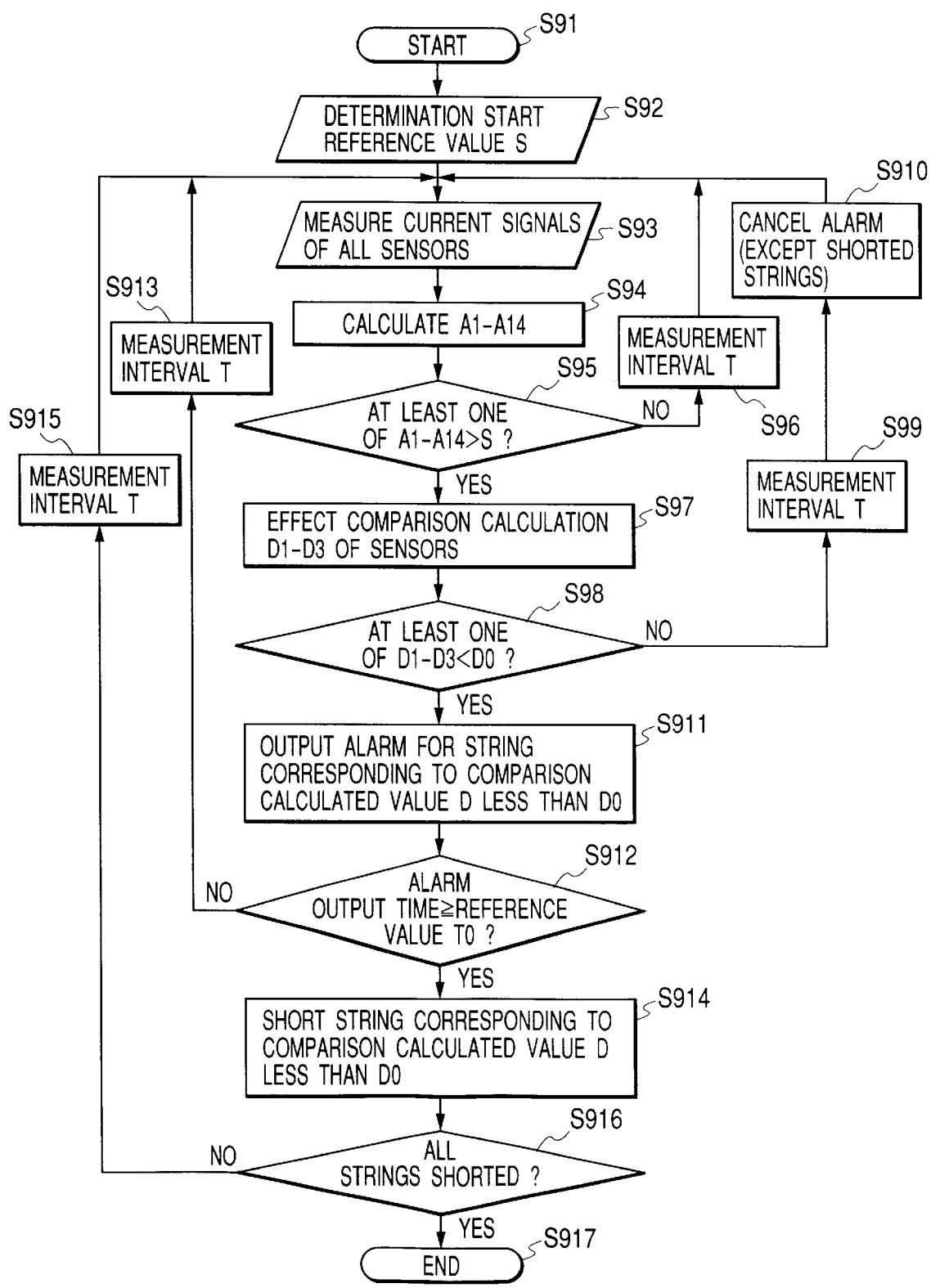
FIG. 22A is a flowchart for explaining a method of controlling the photovoltaic power generation system according to Example 7A of the present invention.

A flowchart of the control method of the present example is presented in FIG. 22A.

First, the determination start reference value S is set (step S92) and the shunt resistors R1 to R14 are used as the current detecting means for detecting the operating currents of the sensors (solar cells). The voltages at the both ends of the shunt resistors R1 to R14 are calculated from the operating currents detected and the resistances of the shunt resistors through which the currents flow, and are denoted by C1 to C14, respectively (the operating currents of the sensors are detected as reduced voltage values). The voltages C1 to C14 are inputted at fixed intervals T (measurement intervals of 1 sec in the present example) into the analog/digital converter 41 (step S93). Then, the following calculations of A1 to A14 (Ax; x=1–14) are carried out using the measured end voltages C1 to C14, thereby normalizing the output signal values of the sensors (step S94).

A1=C1/Cpms1
A2=C2/Cpms2
A3=C3/Cpms3
A4=C4/Cpms4
A5=C5/Cpms5
A6=C6/Cpms6
A7=C7/Cpms7
A8=C8/Cpms8
A9=C9/Cpms9
A10=C10/Cpms10
A11=C11/Cpms11
A12=C12/Cpms12
A13=C13/Cpms13
A14=C14/Cpms14

A1 to A6 are calculated based on the measured values of the sensors 12c, 12d, 12e, 12f, 12m, and 12n (the voltages at the both ends of the shunt resistors R1 to R6) provided around the string 11a. A5 to A10 are calculated based on the measured values of the sensors 12b, 12n, 12m, 12g, 12k, and 12l (the voltages at the both ends of the shunt resistors R5 to R10) provided around the string 11b. A9 to A14 are calculated based on the measured values of the sensors 12a, 12k, 12l, 12h, 12i, and 12j (the voltages at the both ends of the shunt resistors R9 to R14) provided around the string 11c.

When at least one of A1 to A14 (Ax; x=1–14) is larger than the determination start reference value S, the following sensor comparison calculations Dy (Dy; y=1–3) are carried out for the short circuit conditions of the strings 11a, 11b, 11c, based on A1 to A14 (step S97).

(Comparison Calculation of the Sensors for the String 11a)

$$D1 = (\text{minimum of } A1 \text{ to } A6)/(\text{maximum of } A1 \text{ to } A6)$$

(Comparison Calculation of the Sensors for the String 11b)

$$D2 = (\text{minimum of } A5 \text{ to } A10)/(\text{maximum of } A5 \text{ to } A10)$$

(Comparison Calculation of the Sensors for the String 11c)

$$D3 = (\text{minimum of } A9 \text{ to } A14)/(\text{maximum of } A9 \text{ to } A14)$$

When all A1 to A14 are smaller than the determination start reference value S (step S95), the sensor comparison calculations are not carried out and the flow returns through a measurement interval T (steps S96) to step S93.

When at least one of the calculated values D1 to D3, Dy (Dy; y=1–3), is smaller than the sensor current comparison reference value D0 (0.9 in the present example) (step S98), an alarm for an objective string (a string corresponding to the comparison calculated value D smaller than the comparison reference value D0) is first outputted (step S911). For example, when D1 is smaller than D0, an alarm for the string 11a corresponding to the comparison calculated value D1 is displayed on the screen of the personal computer 42. Another alarm device may also be used instead of the output of the alarm on the screen of the personal computer.

When all the comparison calculated values D1 to D3 are larger than the sensor current comparison reference value D0 (step S98), the flow goes through a measurement interval T (step S99) to cancel the alarm (step S910). When there is a shorted string, the alarm is canceled for the strings other than the shorted string (step S910).

Then, the current signals of the respective sensors are repeatedly measured continuously at the fixed intervals T (1 sec in the present example), and the comparison calculations D of the sensors are carried out. When at least one of D1 to D3 is smaller than the sensor current comparison reference value D0 even after the alarm output reference time T0 (5 sec in the present example), the personal computer 42 emits the digital output 43 to energize the photocoupler of the switch control unit 44 of the objective string (the string corresponding to the comparison calculated value D smaller than the comparison reference value D0), based on the digital output 43, perform switching of the external dc power supply, supply the voltage to the switch 61 of the dc electromagnetic contactor, short the switch 61, and short the objective string (step S914).

When the alarm output time is less than the reference value T0, the flow returns through a measurement interval T (step S913) to step S93.

When there exists a non-shorted string (step S916), the flow returns through a measurement interval T (step S915) to steps S93.

When all the strings are shorted (step S916), the processing is ended (step S917).

The switching state of the switch 61 of the dc electromagnetic contactor for shorting string is retained before a release operation is carried out. The above release operation may be conducted manually or automatically.

EXAMPLE 7B

Figure 22B:
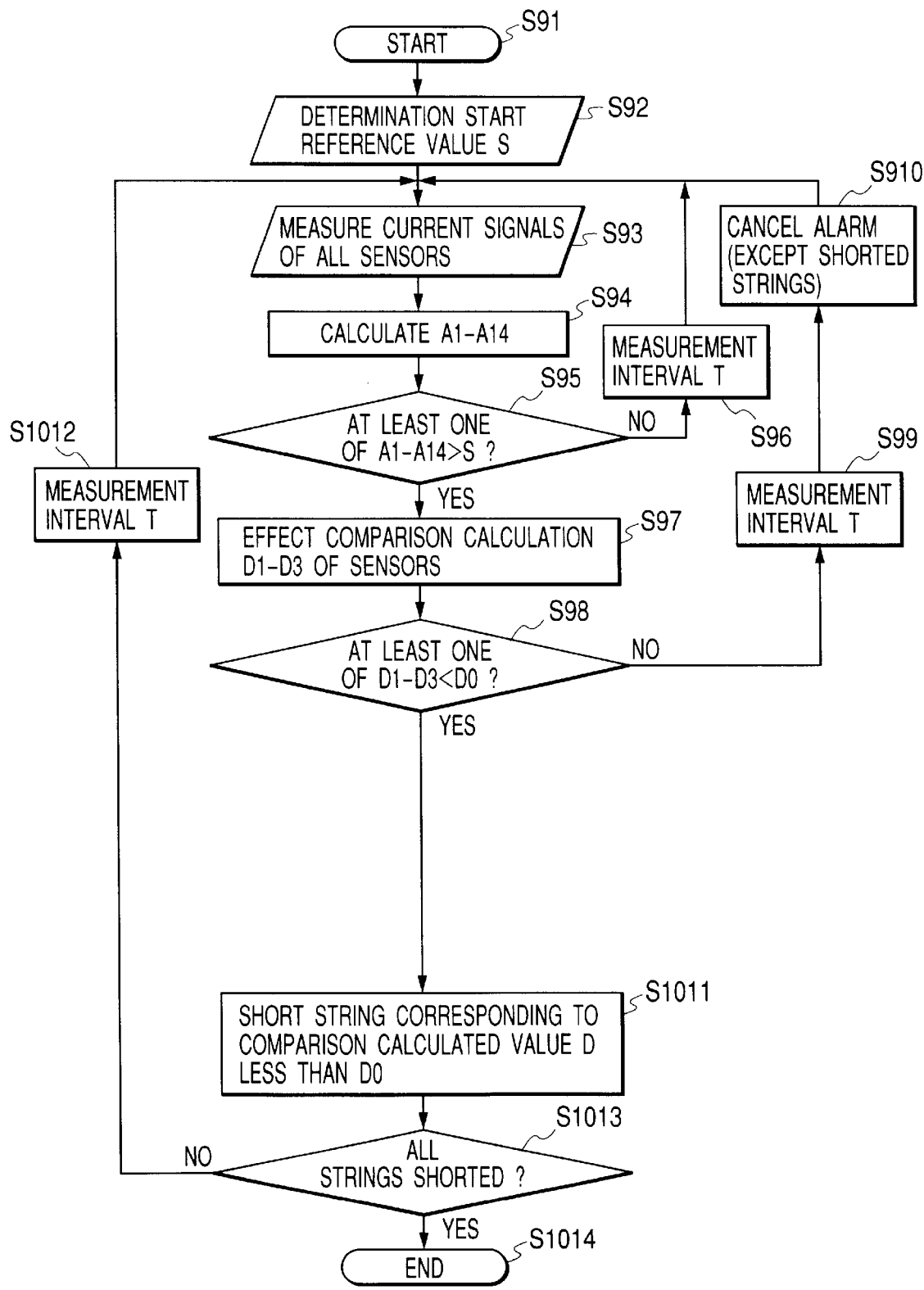
FIG. 22B is a flowchart for explaining a method of controlling the photovoltaic power generation system according to Example 7B of the present invention.

Example 7B is substantially the same as Example 7A except that the photovoltaic power generation system is controlled based on the flowchart shown in FIG. 22B.

Specifically, Example 7B is different from Example 7A in that when at least one of the calculated values D1 to D3 is smaller than the sensor current comparison reference value D0 (step S98), no alarm is outputted and the objective string (the string corresponding to the comparison calculated value Dy smaller than the comparison reference value D0) is shorted (step S1011). This configuration can also prevent the electric shock and ensure the safety while preventing the malfunctions such as the unwanted short circuit of the solar cell strings and the like. Since only the objective string is shorted, the power can be supplied from the rest strings.

The configuration of Example 7A is more preferable in that a sudden halt of power generation can be avoided by output of an alarm (step S911 in FIG. 22A).

As described above, the photovoltaic power generation system and the control method of the photovoltaic power generation system according to the present invention are configured to prevent an electric shock on an intruder by providing the detecting means capable of detecting intrusion of the intruder into the restricted area including the installation area of the solar cell modules and activating the predetermined electric shock preventing means by the signal outputted from the detecting means upon detection of the intruder, so that it is feasible to detect the intruder and prevent the intruder from receiving an electric shock. In addition, since the safeguard becomes effective approximately at the same time as the detection of the intruder, the safety can be enhanced more and the manager or the person concerned does not have to always monitor the system. Therefore, the number of guards can be reduced and this permits reduction of cost.

Another control method of the photovoltaic power generation system according to the present invention is configured to detect the output signal of one sensor or output signals of plural sensors located around the solar cell array or around each string of the solar cell array and control the switch for establishing a short circuit between the output terminals of the solar cell array or each string, based on the output signals, so that when it is determined that a human shadow is detected in a local part of the array from the output signal of the sensor, the array or the string is shorted by controlling the switch between the terminals of the array or the string, whereby it is feasible to prevent an electric shock hazard which can occur when a man touches a defective insulation part such as breakage of the surface coating of the solar cell module, a crack, a scar, deformation, etc. of the surface glass, and so on.

Since the signals of the respective sensors are compared with each other, the electric shock hazard can be prevented while preventing the malfunctions such as the unwanted alarm output, the unwanted short circuit of the solar cell array, and so on.

What is claimed is:

1. A photovoltaic power generation system comprising a solar cell module, a restricted area including an area having the solar cell module installed therein, detecting means for detecting intrusion of an intruder into the restricted area to output a signal, electric shock preventing means activated by the signal outputted from the detecting means, first means for preventing the intrusion of the intruder into the restricted area, and second means for preventing the intrusion of the intruder provided around said first means for preventing the intrusion of the intruder, wherein the detecting means is mounted on said first means for preventing the intrusion of the intruder.

2. The photovoltaic power generation system according to claim 1, wherein the first means for preventing the intrusion of the intruder is a stockade, a wall, a fence, or a ditch.

3. The photovoltaic power generation system according to claim 1, wherein the detecting means is a proximity sensor, an optical sensor, a magnetic sensor, a magnet sensor, a temperature sensor, a humidity sensor, an impact sensor, an acceleration sensor, a weight sensor, a current sensor, or an electromagnetic sensor.

4. The photovoltaic power generation system according to claim 1, wherein the electric shock preventing means is means for shorting the solar cell module or a solar cell string consisting of a plurality of the solar cell modules.

5. The photovoltaic power generation system according to claim 1, wherein the electric shock preventing means comprises a circuit breaker and the circuit breaker disconnects the solar cell module or the solar cell string from the photovoltaic power generation system to deactivate the module or the string.

6. The photovoltaic power generation system according to claim 4, wherein the solar cell string is at least two solar cell strings connected in parallel to each other.

7. The photovoltaic power generation system according to claim 1, wherein the electric shock preventing means has a function of releasing an electric shock preventing action.

8. The photovoltaic power generation system according to claim 1, wherein the solar cell module is installed so that a photovoltaic element provided in an outermost surface on a light-receiving side is exposed directly to the atmosphere without protection by a protective covering on the light-receiving side.

9. The photovoltaic power generation system according to claim 1, wherein the solar cell module has a coating only on an outermost surface on a light-receiving side.

10. The photovoltaic power generation system according to claim 1, wherein said solar cell module is arranged among a plurality of solar cell modules, each of said plurality of solar cell modules having a coating on a light-receiving side distinct from the coatings of the others of said plurality of solar cell modules.

11. The photovoltaic power generation system according to claim 1, wherein electrically live portions of the photovoltaic power generation system have no protective covering in part.

12. A method of controlling a photovoltaic power generation system comprising a solar cell module, a restricted area including an area in which the solar cell module is installed, detecting means for detecting intrusion of an intruder into the restricted area, electric shock preventing means, first means for preventing the intrusion of the intruder into the restricted area, and second means for preventing the intrusion of the intruder provided around said first means for preventing the intrusion of the intruder, wherein when the detecting means detects the intrusion of the intruder into the restricted area, the electric shock preventing means is activated based on a signal outputted from the detecting means, and wherein the detecting means is mounted on said first means for preventing the intrusion of the intruder.

13. The method according to claim 12, wherein the first means for preventing the intrusion of the intruder is a stockade, a wall, a fence, or a ditch.

14. The method according to claim 12, wherein the detecting means is a proximity sensor, an optical sensor, a magnetic sensor, a magnet sensor, a temperature sensor, a humidity sensor, an impact sensor, an acceleration sensor, a weight sensor, a current sensor, or an electromagnetic sensor.

15. The method according to claim 12, wherein the electric shock preventing means is means for shorting the solar cell module or a solar cell string consisting of the solar cell modules connected in series.

16. The method according to claim 12, wherein the electric shock preventing means comprises a circuit breaker and the circuit breaker disconnects the solar cell module or the solar cell string from the photovoltaic power generation system to deactivate the module or the string.

17. The method according to claim 15 or 16, wherein the solar cell string is at least two solar cell strings connected in parallel to each other.

18. The method according to claim 12, wherein the electric shock preventing means has a function of releasing the electric shock preventing means.

19. The method according to claim 12, wherein the solar cell module is installed so that a photovoltaic element provided in an outermost surface on a light-receiving side is exposed directly to the atmosphere without protection by a protective covering on the light-receiving side.

20. The method according to claim 12, wherein the solar cell module has a coating only on an outermost surface on a light-receiving side.

21. The method according to claim 12, wherein said solar cell module is arranged among a plurality of solar cell modules, each of said plurality of solar cell modules having a coating on a light-receiving side distinct from the coatings of the others of said plurality of solar cell modules.

22. The method according to claim 12, wherein electrically live portions of the photovoltaic power generation system have no protective covering in part.

* * * * *

UNITED STATES PATENT AND TRADEMARK OFFICE
CERTIFICATE OF CORRECTION

PATENT NO.   : 6,653,549 B2
DATED        : November 25, 2003
INVENTOR(S)  : Masaaki Matsushita et al.

It is certified that error appears in the above-identified patent and that said Letters Patent is hereby corrected as shown below:

Column 2,
Line 6, "becoming" should read -- become --.
Line 7, "these" should read -- recent --.

Column 20,
Line 28, "110176" should read -- 1106 --

Column 26,
Line 25, "steps S93." should read -- step S93. --.
Line 46, "rest" should read -- rest of the --.

Signed and Sealed this

Sixth Day of July, 2004

JON W. DUDAS
*Acting Director of the United States Patent and Trademark Office*